US009454072B2

(12) United States Patent
Levinski et al.

(10) Patent No.: US 9,454,072 B2
(45) Date of Patent: Sep. 27, 2016

(54) METHOD AND SYSTEM FOR PROVIDING A TARGET DESIGN DISPLAYING HIGH SENSITIVITY TO SCANNER FOCUS CHANGE

(71) Applicant: KLA-Tencor Corporation, Milpitas, CA (US)

(72) Inventors: Vladimir Levinski, Nazareth Ilit (IL); Yoel Feler, Haifa (IL); Daniel Kandel, Aseret (IL)

(73) Assignee: KLA-Tencor Corporation, Milpitas, CA (US)

(*) Notice: Subject to any disclaimer, the term of this patent is extended or adjusted under 35 U.S.C. 154(b) by 136 days.

(21) Appl. No.: 14/074,412

(22) Filed: Nov. 7, 2013

(65) Prior Publication Data

US 2014/0141536 A1 May 22, 2014

Related U.S. Application Data

(60) Provisional application No. 61/724,754, filed on Nov. 9, 2012, provisional application No. 61/730,719, filed on Nov. 28, 2012, provisional application No. 61/736,442, filed on Dec. 12, 2012, provisional application No. 61/760,641, filed on Feb. 4, 2013.

(51) Int. Cl.
| | |
|---|---|
| *G06F 17/50* | (2006.01) |
| *G03F 1/38* | (2012.01) |
| *G01B 11/14* | (2006.01) |
| *G03F 7/20* | (2006.01) |
| *G03F 1/70* | (2012.01) |

(52) U.S. Cl.
CPC ............... *G03F 1/38* (2013.01); *G01B 11/14* (2013.01); *G03F 7/70641* (2013.01); *G03F 7/70683* (2013.01); *G03F 1/70* (2013.01)

(58) Field of Classification Search
CPC .. G03F 7/70641; G03F 7/70683; G03F 1/38; G03F 1/70
See application file for complete search history.

(56) References Cited

U.S. PATENT DOCUMENTS

| | | | |
|---|---|---|---|
| 6,885,429 | B2 | 4/2005 | Lyons et al. |
| 7,545,520 | B2 | 6/2009 | Lee et al. |
| 7,916,284 | B2 | 3/2011 | Dusa et al. |
| 7,970,485 | B2 | 6/2011 | Wang |
| 2008/0247632 | A1 | 10/2008 | Boehm et al. |
| 2008/0297752 | A1 | 12/2008 | Wang et al. |
| 2011/0249244 | A1 | 10/2011 | Leewis et al. |

(Continued)

OTHER PUBLICATIONS

T.A. Brunner et al., Process Monitor Gratings, Metrology, Inspection, and Process Control for Microlithography XXI, Proc. of SPIE, vol. 6518, pp. 651803-1-651803-9, Mar. 2007.

(Continued)

*Primary Examiner* — Stewart Fraser
(74) *Attorney, Agent, or Firm* — Suiter Swantz pc llo

(57) ABSTRACT

A segmented mask includes a set of cell structures, wherein each cell structure includes a set of features having an unresolvable segmentation pitch along a first direction, wherein the unresolvable segmentation pitch along the first direction is smaller than the illumination of the lithography printing tool, wherein the plurality of cell structures have a pitch along a second direction perpendicular to the first direction, wherein the unresolvable segmentation pitch is suitable for generating a printed pattern for shifting the best focus position of the lithography tool by a selected amount to achieve a selected level of focus sensitivity.

21 Claims, 32 Drawing Sheets

(56) References Cited

U.S. PATENT DOCUMENTS

| | | | | |
|---|---|---|---|---|
| 2012/0033215 A1* | 2/2012 | Kandel | ............... | G03F 7/70633 356/366 |
| 2012/0057159 A1* | 3/2012 | Deckers | ................... | G03F 1/42 356/401 |
| 2013/0040230 A1* | 2/2013 | Spaziani | ............... | G03F 7/2037 430/5 |
| 2013/0293890 A1* | 11/2013 | Amir | ..................... | G01B 11/14 356/401 |

OTHER PUBLICATIONS

Christopher P. Ausschnitt et al., Seeing the forest for the trees: a new approach to CD control, Metrology, Inspection, and Process Control for Microlithography XII, Proc. SPIE 3332, Jun. 8, 1998, pp. 212-220.

T.A. Brunner et al., Quantitative stepper metrology using the focus monitor test mask, Optical/Laser Microlithography VII, Proc. of SPIE 2187, May 17, 1994, pp. 541-549.

* cited by examiner

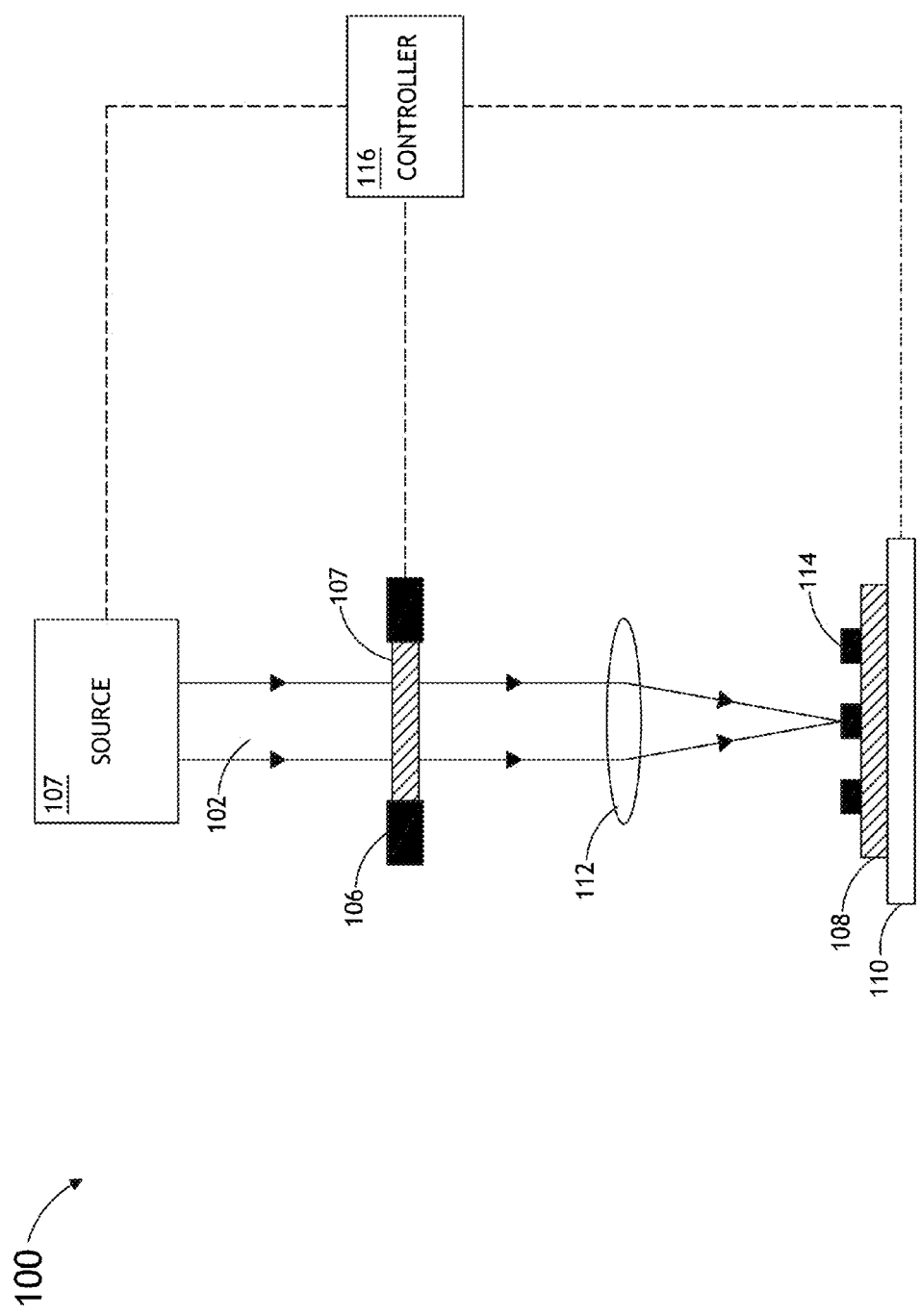

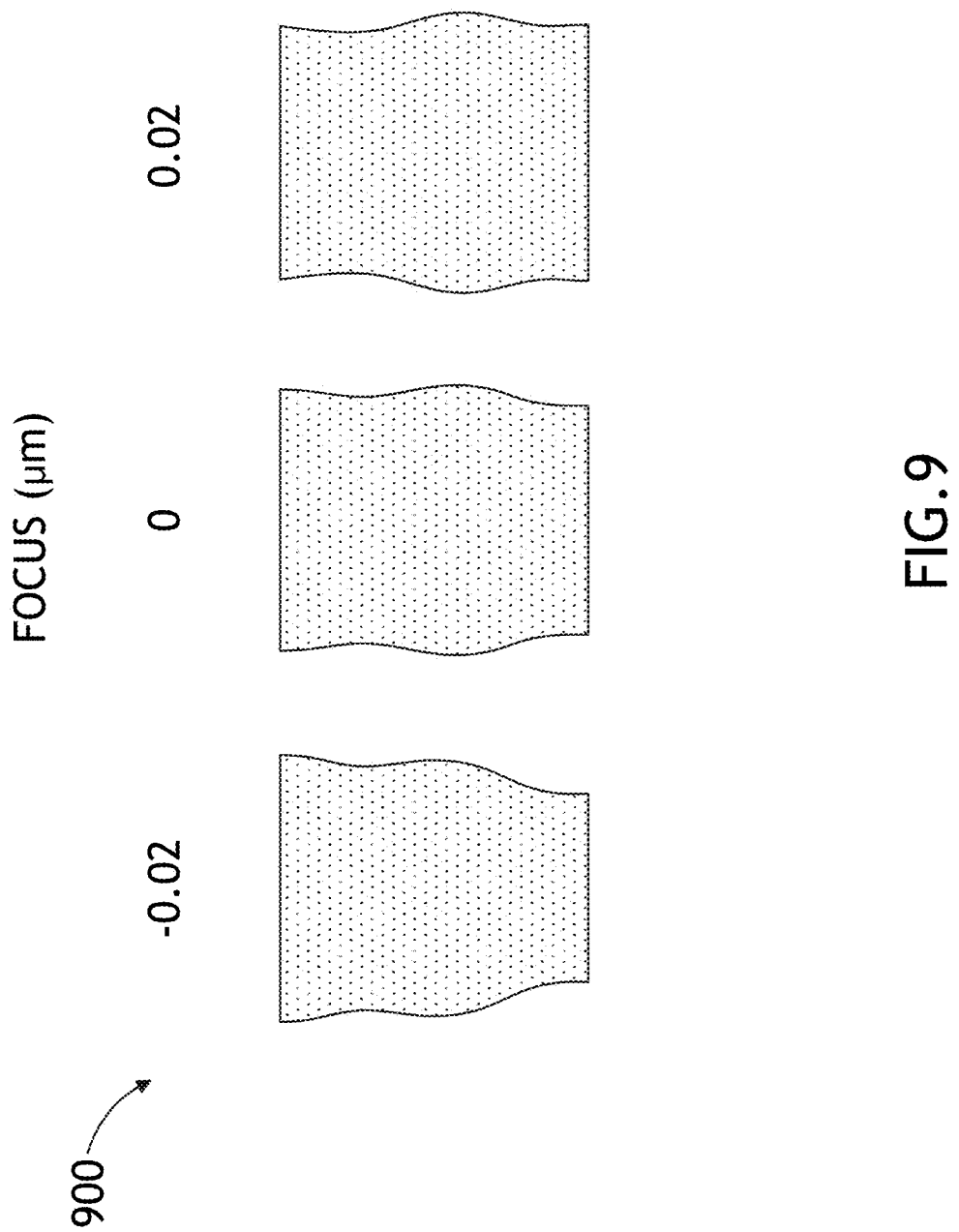

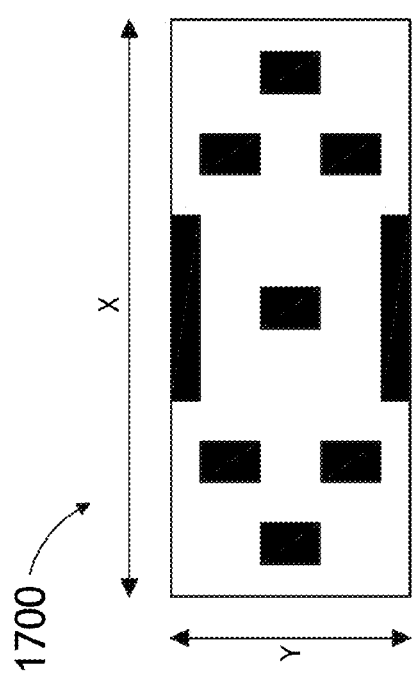
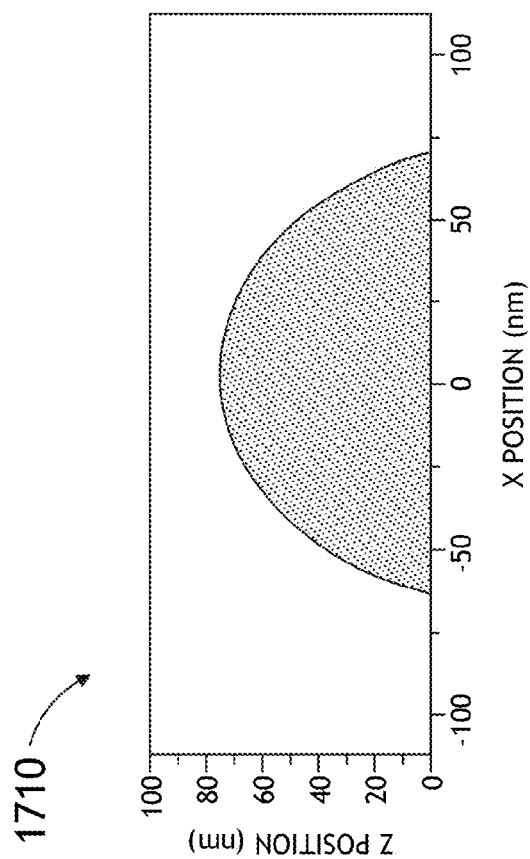
FIG. 17A
FIG. 17B

1910

1920

1930

1940

METHOD AND SYSTEM FOR PROVIDING A TARGET DESIGN DISPLAYING HIGH SENSITIVITY TO SCANNER FOCUS CHANGE

CROSS-REFERENCE TO RELATED APPLICATION

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)).

RELATED APPLICATIONS

For purposes of the USPTO extra-statutory requirements, the present application constitutes a regular (non-provisional) patent application of United States Provisional Patent Application entitled QUANTIFYING LITHOGRAPHIC SCANNER RECIPE BEST FOCUS FROM DIRECT ANALYSIS OF SCATTEROMETRY TOOL RAW DATA COLLECTED FROM ARBITRARY PATTERNS ON FOCUS AND EXPOSURE MATRIX WAFERS, naming Vladimir Levinski, Yoel Feler and Daniel Kandel as inventors, filed Nov. 9, 2012, Application Ser. No. 61/724,754.

For purposes of the USPTO extra-statutory requirements, the present application constitutes a regular (non-provisional) patent application of United States Provisional Patent Application entitled OPTIMAL TARGET DESIGN FOR SCANNER FOCUS AND DOSE METROLOGY, naming Vladimir Levinski, Yoel Feler and Daniel Kandel as inventors, filed Nov. 28, 2012, Application Ser. No. 61/730,719.

For purposes of the USPTO extra-statutory requirements, the present application constitutes a regular (non-provisional) patent application of United States Provisional Patent Application entitled NOVEL TARGET DESIGN AND MEASUREMENT FOR SCANNER DOSE AND METROLOGY, naming Vladimir Levinski, Yoel Feler and Daniel Kandel as inventors, filed Dec. 12, 2012, Application Ser. No. 61/736,442.

For purposes of the USPTO extra-statutory requirements, the present application constitutes a regular (non-provisional) patent application of United States Provisional Patent Application entitled FOCUS OFFSET TARGETS AND THEIR USAGE FOR SCANNER FOCUS AND DOSE METROLOGY, naming Vladimir Levinski, Yoel Feler and Daniel Kandel as inventors, filed Feb. 4, 2013, Application Ser. No. 61/760,641.

TECHNICAL FIELD

The present invention generally relates to a method and system for producing printed patterns for causing a shift in the best focus position of a lithography printing tool.

BACKGROUND

As demand for ever-shrinking semiconductor devices continues to increase, so too will the demand for improved lithographic processing techniques used for fabricating semiconductor devices. Lithographic printing tools, such as scanners and steppers are required to maintain focus within the range of ±10 nm around the nominal focus position for recent node and this requirement will become even more stringent in the future.

Prior methods to enhance pattern sensitivity to focus changes include the use of isolated lines. Further, software is used to generate a library of simulated spectra, using material properties, such as n and k values, of the resist, antireflective coatings, planarization films and the like. Such approaches further include the use of nominal test target structure parameters (e.g., line width, sidewall angle and height), reasonable expected ranges of target structure parameter variation, and scatterometry tool optical parameters (e.g., wavelength range, azimuth angle range, angle of incidence range, polarizations and etc.). Spectra are then collected from test targets for all combinations (if possible) of focus and exposure in a focus-expose matrix (FEM) on a test wafer and stored in library. Then, during measurement a closest match is found is the library for each spectrum and the corresponding structure parameters (e.g., line width, sidewall angle, line height and etc.) for the library matches are matched with the programmed focus and exposure combinations from the FEM.

In additional settings a line end shortening effect is measured utilizing an imaging tool. This approach suffers from low sensitivity, which is compounded near the best scanner focus position, where the behavior of the measured target parameter is parabolic with respect to scanner focus change.

The utilization of phase shift masks allows for the achievement of high sensitivity to scanner focus changes by converting changes in focus to alignment errors, which that can be measured with an overlay measurement tool. However, phase shift masks are typically not used in production as they lead to significant cost increases. As such, it is desirable to provide improved methods and systems that act to cure the defects of the prior art.

SUMMARY OF THE INVENTION

A lithography mask for producing printed patterns for causing a shift in best focus position of a lithography printing tool is disclosed. In one aspect, the mask may include, but is not limited to, a plurality of cell structures formed from a substantially opaque material, wherein each cell structure includes a set of features having an unresolvable segmentation pitch along a first direction, wherein the unresolvable segmentation pitch along the first direction is smaller than the minimal design rule pitch, wherein the plurality of cell structures have a pitch along a second direction perpendicular to the first direction, wherein the unresolvable segmentation pitch is suitable for generating a printed pattern for shifting the best focus position of the lithography tool by a selected amount to achieve a selected level of focus sensitivity.

In another aspect, the mask may include, but is not limited to, a first one-dimensional structure formed from a first set of sub-structures having a first pitch along a first direction; and at least one additional one-dimensional structure formed from an additional set of sub-structures having a second pitch along the first direction, wherein the first one-dimensional structure is periodic along a second direction perpendicular to the first direction with a third pitch, wherein the at least one additional one-dimensional structure is periodic along the second direction perpendicular to the first direction with a fourth pitch, wherein at least one of the first pitch, the second pitch, the third pitch and the fourth pitch is unresolvable by illumination of the lithography printing tool.

A method for measuring focus changes in a lithography printing device is disclosed. In one embodiment, the method may include, but is not limited to, measuring alignment error between a first asymmetric cell and at least a second asymmetric cell of a printed segmented target, wherein the segmented targeted includes a plurality of asymmetric cells, wherein each asymmetric cell includes a plurality of assist features; and determining a change in focus of a lithographic printing tool based on the measured alignment error between the first cell and the at least a second cell of the printed segmented target.

In another aspect, the method may include, but is not limited to, measuring alignment error between a first asymmetric cell and at least a second asymmetric cell of a printed segmented target, wherein the segmented targeted includes a plurality of asymmetric cells, wherein each asymmetric cell includes a plurality of assist features; and determining a change in focus of a lithographic printing tool based on the measured alignment error between the first cell and the at least a second cell of the printed segmented target.

A method for determining one or more mask designs suitable for creating printed patterns sensitive to focus is disclosed. In one embodiment, the method may include, but is not limited to, generating a plurality of lithographic mask designs; printing a plurality of printed patterns on a wafer based on the generated lithographic mask designs, the printed patterns having different focus offsets; measuring at least one parameter of at least three of the printed patterns with at least one metrology tool; and determining a focus position corresponding to an extremum associated with a curve fitted to the measured at least one parameters of the at least three of the printed patterns.

In another aspect, the method may include, but is not limited to, generating a plurality of lithographic mask designs corresponding to a selected application; calculating an aerial image for each of the generated lithographic mask designs in a selected focus condition; and determining one or more lithographic mask designs of the plurality of lithographic mask designs satisfying a selected aerial image threshold based on a selected application.

In another aspect, the method may include, but is not limited to, generating a plurality of lithographic mask designs; simulating a portion of a lithographic process corresponding with generation of a printed pattern for each of the lithographic mask designs; and selecting two or more of the lithographic mask designs having different focus offsets, wherein each of the selected two or more of the lithographic mask designs are focus sensitive and printable.

A lithography printing tool for printing patterns is disclosed. In one embodiment, the lithography printing tool includes, but is not limited to, a radiation source; a mask support device configured to secure a segmented mask, wherein the segmented mask includes a plurality of cell structures formed from a substantially opaque material, wherein each cell structure includes a set of features having an unresolvable segmentation pitch, wherein the unresolvable segmentation pitch along a first direction is smaller than the illumination of the lithography printing tool, wherein the plurality of cell structures have a pitch along a second direction perpendicular to the first direction, wherein the unresolvable segmentation pitch is suitable for generating a printed pattern for shifting the best focus position of the lithography tool by a selected amount to achieve a selected level of focus sensitivity; and a set of projection optics configured to direct illumination transmitted by the mask onto a wafer.

In another aspect, the lithography printing tool includes, but is not limited to, a radiation source; a mask support device configured to secure a segmented mask, wherein the segmented mask includes a first one-dimensional structure formed from a first set of sub-structures having a first pitch along a first direction; and at least one additional one-dimensional structure formed from an additional set of sub-structures having a second pitch along the first direction, wherein the first one-dimensional structure is periodic along a second direction perpendicular to the first direction with a third pitch, wherein the at least one additional one-dimensional structure is periodic along the second direction perpendicular to the first direction with a fourth pitch, wherein at least one of the first pitch, the second pitch, the third pitch and the fourth pitch is unresolvable by illumination of the lithography printing tool; and a set of projection optics configured to direct illumination transmitted by the mask onto a wafer.

BRIEF DESCRIPTION OF THE DRAWINGS

The numerous advantages of the disclosure may be better understood by those skilled in the art by reference to the accompanying figures in which:

FIG. 1A illustrates a simplified schematic view of a system for lithographically printing one or more patterns to a wafer, in accordance with one embodiment of the present invention.

FIG. 9 illustrate the calculated Y-profiles of printed targets for different scanner focus positions, in accordance with one embodiment of the present invention.

FIGS. 17A and 17B illustrate a symmetric mask design utilizing more than two different regions per period, in accordance with one embodiment of the present invention.

DETAILED DESCRIPTION OF THE INVENTION

Figure 1B:
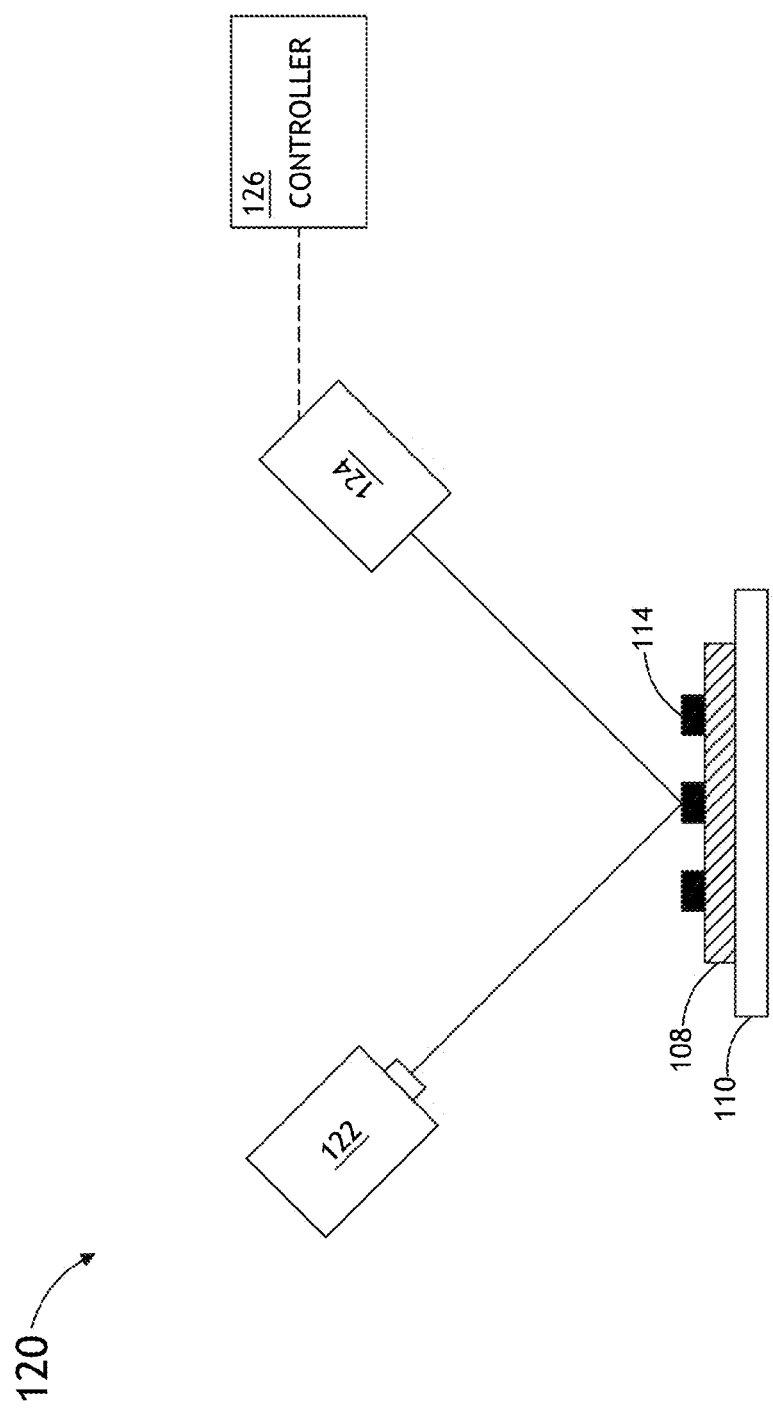
FIG. 1B illustrates a metrology system configured to measure one or more metrology parameters associated with one or more targets, in accordance with one embodiment of the present invention.

Referring generally to FIGS. 1A-21B, systems and methods for providing improved focus measurements in a lithographic printing tool are described. Specifically, the present invention is directed to methods and systems for carrying out design and fabrication of patterns and targets sensitive to changes in the focus of a lithographic printing device (e.g., scanner, stepper or the like). It is noted herein that the primary properties that a printed pattern must satisfy are (i) robustness and (ii) high sensitivity to changes in scanner parameters of interest (since the sensitivity has a direct impact on the accuracy and precision of the measured scanner parameters). The present disclosure, in part, presents a target design for scanner parameter measurement (e.g., focus and dose measurement) suitable for providing high sensitivity to scanner parameter changes without deterioration of robustness, and measurement procedures for making use of the target design.

It is noted herein that in the context of lithographic printing the "best focus" or "iso focus" may be chosen such that the dependence of one or more characteristics of the printed device pattern (e.g., MCD or line-end shortening effect) on changes in the focus position of the lithographic printing tool (e.g., scanner, stepper and the like) is minimal about the focus position.

It is further noted herein that measured signal characteristics from the printed patterns on a wafer generally display a parabolic dependence about the best focus position, significantly reducing sensitivity to changes in focus. Since production lithography tools generally operate most effectively at or near the best focus position, this effect leads to a significant challenge in terms of measuring lithographic printing tool focus with device or device-like features. The challenge is reflected in low sensitivity to focus changes and difficulty in distinguishing the focus change direction. In addition, the side wall angle of a measured pattern feature displays monotonic behavior about the best focus position. However, the scattered signal itself has low sensitivity to this characteristic of the printed pattern (e.g., in scatterometry-based metrology). These problems complicate the focus control in production.

The present invention, in part, is directed to the design of lithography masks and systems suitable for printing patterns, or "targets," onto a wafer, which cause a shift in the best focus position of the illumination of the lithography printing tool in order to enhance focus sensitivity in a given system. In addition, among other things, the present invention is further directed to the selection of mask design for achieving enhance focus sensitivity in a lithography printing tool.

As used throughout the present disclosure, the term "wafer" generally refers to a substrate formed of a semiconductor or non-semiconductor material. For example, a semiconductor or non-semiconductor material include, but are not limited to, monocrystalline silicon, gallium arsenide, and indium phosphide. A wafer may include one or more layers. For example, such layers may include, but are not limited to, a resist, a dielectric material, a conductive material, and a semiconductive material. Many different types of such layers are known in the art, and the term wafer as used herein is intended to encompass a wafer on which all types of such layers may be formed. One or more layers formed on a wafer may be patterned or unpatterned. For example, a wafer may include a plurality of dies, each having repeatable patterned features. Formation and processing of such layers of material may ultimately result in completed devices. Many different types of devices may be formed on a wafer, and the term wafer as used herein is intended to encompass a wafer on which any type of device known in the art is being fabricated. In addition, for the purposes of the present disclosure, the terms patterning device, mask and reticle should be interpreted as interchangeable.

FIG. 1A illustrates a simplified schematic view of a system 100 for lithographically printing one or more patterns to a wafer, in accordance with one embodiment of the present invention. In one embodiment, the system 100 consists of a lithographic printing tool 100. The lithographic printing tool 100 may include any lithographic printing tool known in the art. For example, the lithographic printing tool 100 may include, but is not limited to, a scanner or stepper. In another embodiment, the lithographic printing tool 100 may include a radiation source 102. The radiation source 102 may include any radiation source known in the art suitable for carrying out a lithographic based printing process. For example, the radiation source 102 may include, but is not limited to, an UV, EUV or DUV light source.

In another embodiment, the lithographic printing tool 100 includes a mask support device 106. The mask support device 106 is configured to secure a pattern mask 107. In this regard, the support device 106 may hold the mask 107 utilizing any means known in the art, such as, but not limited to, a mechanical, vacuum, electrostatic or other clamping techniques. In another embodiment, the pattern mask 107 is positioned between the in the illumination path 102 of the lithographic printing tool 100, between the radiation source 104 and the wafer 108 disposed on wafer stage 110. Further, the support device 106 may be configured to actuate or position the pattern mask 107. For example, the support device 106 may actuate the pattern mask 107 to a selected position with respect to the projection optics 112 of the system 100. In another embodiment, the projection optics 112 of the system 100 may act to project the transmitted pattern onto the resist material of wafer 108, thereby transferring the mask pattern to the wafer.

In another embodiment, a computer controller 116 may control the various sub-systems of the lithography tool 100 in any manner known in the art. In another embodiment, the computer controller 116 may serve as a computation system and may include one or more processors configured to execute program instructions maintained on a non-transitory medium (not shown). In this regard, the one or more processors of controller 126 may execute any of the various process steps described throughout the present invention. It is noted herein that the lithographic printing tool 100 of the present invention may implement any of the mask designs described throughout the present disclosure. Lee et al. generally describe mask-based lithography in U.S. Pat. No. 7,545,520, issued on Jun. 9, 2009, which is incorporated herein in the entirety.

FIG. 1B illustrates a metrology system 120 configured to measure one or more metrology parameters associated with the one or more targets 112 printed on wafer 108. In one embodiment, the metrology system 120 may include a scatterometry based metrology tool, as shown in FIG. 1B. In this regard, the metrology tool 120 may include, but is not limited to, a light source 122 suitable for directing light toward the target structures 114 of wafer 108. In turn, a detector 124 may collect light scattered from the target structures 114. Then, a controller 126 may receive the measured data from the detector 124 and perform any metrology analysis known in the art. In one embodiment, the computer controller 126, or "computation system," of the metrology tool 120 may include, but is not limited to, one or more processors configured to execute program instructions maintained on a non-transitory medium (not shown). In this regard, the one or more processors may execute any of the various process steps described throughout the present invention. It is noted herein that the metrology tool 120 of the present invention is configured to measure one or more parameters from any of the generated targets described throughout the present invention.

Figure 1C:
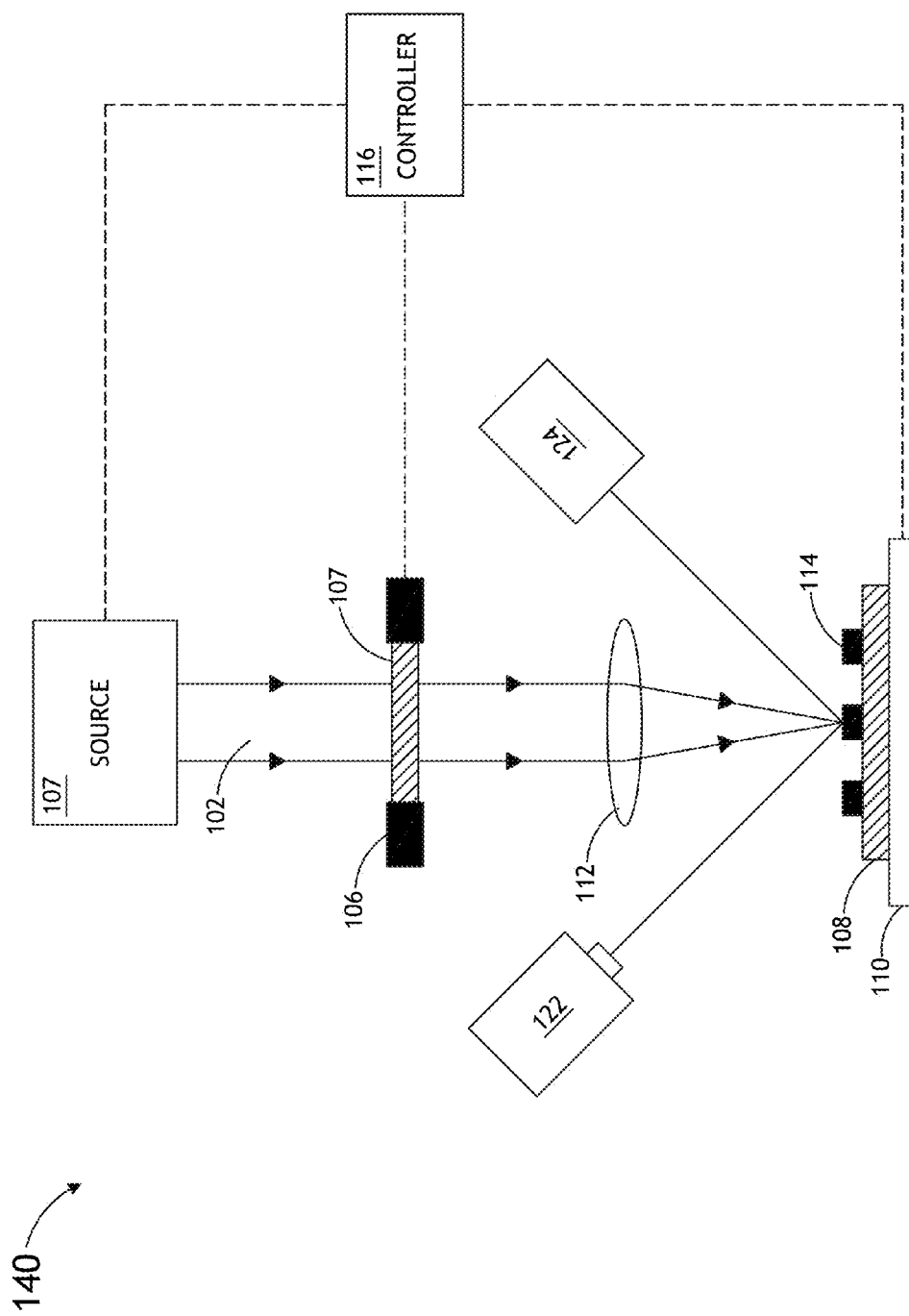
FIG. 1C illustrates an integrated metrology-lithography system, in accordance with one embodiment of the present invention.

It is noted herein that while the lithography tool 100 and metrology tool 120 described above have been discussed in the context of separate system, it is contemplated herein that the systems may be integrated, as shown in FIG. 1C. It is further recognized that the physically integrated metrology and lithography tools may share a common controller 142.

Figure 1D:
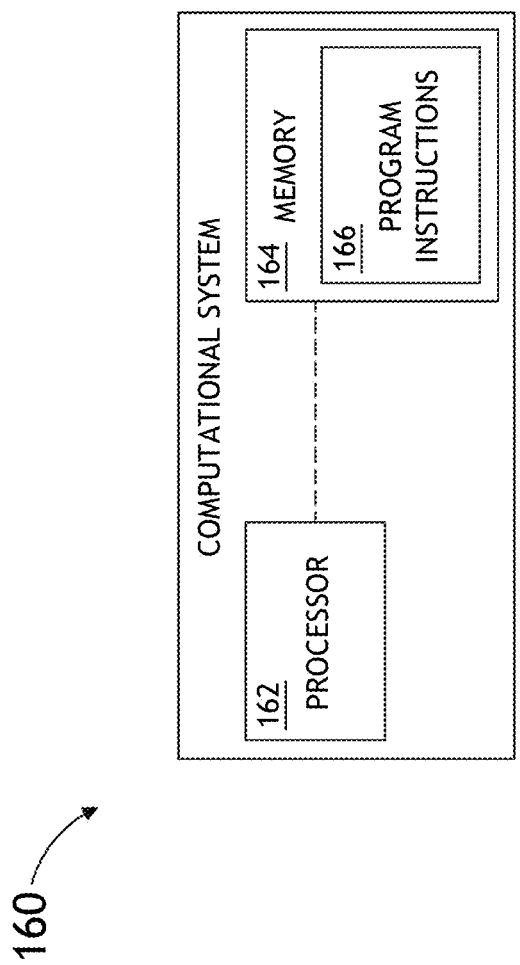
FIG. 1D illustrates an off-line stand-alone computational system suitable for calculating one or more parameters, in accordance with one embodiment of the present invention.

It is further recognized that any one of the various data processing or computation steps described in the present disclosure may be carried out on a stand-alone computation system, such as system 160 in FIG. 1D. In one embodiment, the stand-along computation system 160 may include one or more processors 162 and memory configured to maintain one or more sets of program instructions 164. The program instructions 164 are configured carry out any of the various computation or data processing steps described throughout the present disclosure.

Figure 2:
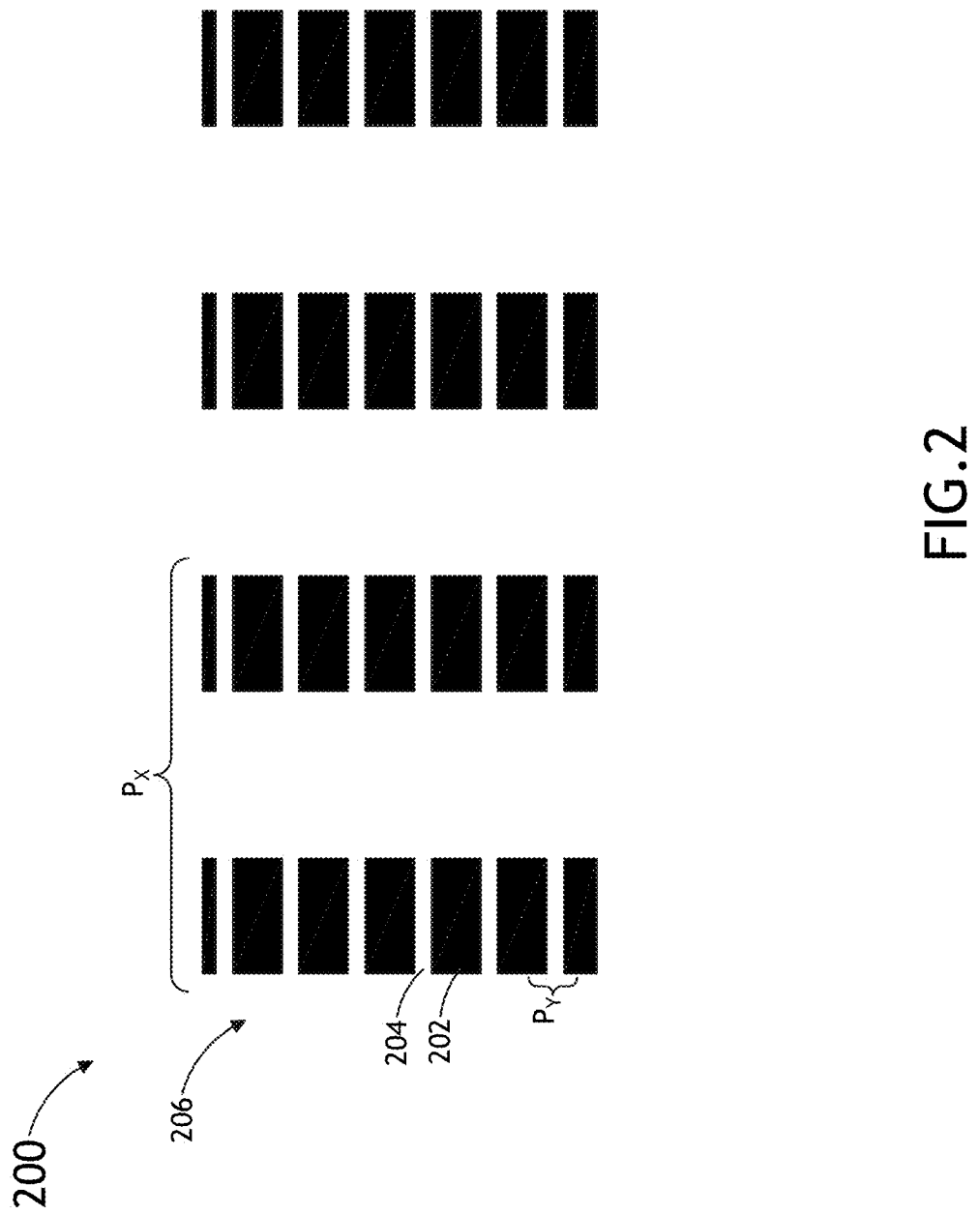
FIG. 2 illustrates a segmented pattern of a segmented lithography mask for implementation in a lithographic printing tool, in accordance with an embodiment of the present invention.

FIG. 2 illustrates a segmented pattern 200 of a segmented lithography mask for implementation in a lithographic printing tool 100, in accordance with an embodiment of the present invention. It is noted herein that the pattern mask 107 utilized by system 100 may include, but is not limited to, a segmented pattern mask. In this regard, the segmented pattern mask may include a segmented pattern 200, but is not limited to implementing the specific pattern 200, suitable for printing one or more metrology target patterns on the wafer 108.

It is further noted herein that the implementation of a small pitch segmentation 200 in mask 107 to generate printed pattern targets may provide enhanced sensitivity to scanner focus position changes. In this regard, the implementation of small pitch segmentation 200 in mask 107 may serve to provide printed target patterns that correspond to the focus range sensitive to focus changes in the lithographic printing tool 100 (e.g., scanner, stepper or the like).

In the case of small pitch targets the resulting aerial image is caused by interference between the 0th and ±1st diffraction orders of the illumination beam 102 transmitted through the mask 107. In this case, the dependence of the light intensity in the resist on the focus position of the lithographic printing tool 100 arises from the dependence of the phase difference between the 0th and ±1st diffraction orders on printing tool 100 focus position. Accordingly, by designing targets which provide an additional phase difference between diffraction orders, the best focus position of such targets may be effectively moved away from the "flat part" of the above mentioned parabola, thereby significantly improving sensitivity of the printed pattern characteristics to changes in lithographic printing tool focus.

Since the natural mask topography (e.g., a standard chrome on glass mask has a thickness of approximately 70 nm) is generally designed for 180 degrees phase shift, effective change in the properties of a material (e.g., chrome) must be induced to provide a plurality of possible phase shifts. It is noted herein that the effective material properties may be changed by implementing a small pitch, sub-resolution segmentation on the mask 102. In this manner, the pitch of the segmentation is unresolved by the lithographic printing tool 100. For example, the small pitch segmentation 200 on the masks may have a scale less than the wavelength of the illumination used in the lithographic printing process. By way of another example, the small pitch segmentation 200 on the masks may have a scale less than a minimal design rule. For instance, in wafer coordinates, an appropriate segmentation pitch may fall in the range of 10-30 nm (or 40-120 nm in mask coordinates depending on the geometry of the implementing system).

It is noted that the degree of the best focus position shift depends on various parameters of the printed pattern of the targets and various parameters of small pitch segmentation. For example, the specific value of the best focus position shift may depend on pitch in the x-direction (Px), the pitch in the y-direction (Py) and/or duty cycles in both directions, discussed in greater detail further herein.

It is noted herein that the segmentation discussed throughout the present disclosure is not required to be purely periodical. Further, the segmentation is not limited to one-dimension (i.e., slits), as discussed further herein. It is noted that one important property is the small scale of the assist features (e.g., simple slit or other binary feature), which enable the whole structure to function similarly to a phase shift mask. It is further noted that periodic structures with small unresolved pitch are particularly advantageous as they provide for easier modeling in the case of full modeling for focus and dose measurements.

Figure 3:
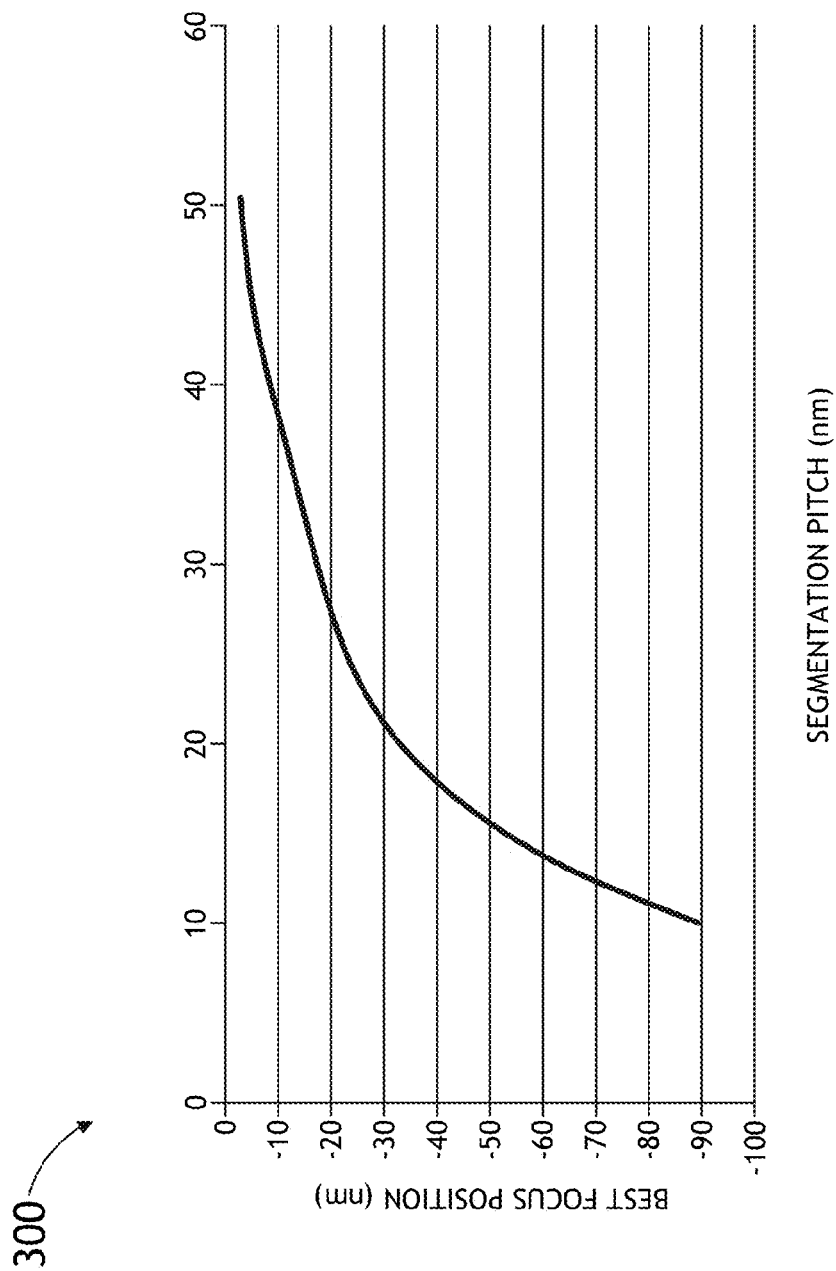
FIG. 3 illustrates a graph of best focus position shift as a function of segmentation pitch, in accordance with one embodiment of the present invention.

FIG. 3 illustrates a graph 300 of best focus position shift as a function of segmentation pitch. For the example shown in graph 300, the shift in best focus position is largest for small segmentation and becomes negligible as the segmentation approaches a spacing larger than 50 nm. In this regard, Applicants note that resolved segmentation (i.e., segmentation larger than the wavelength of illumination) does not provide sufficient shift in the best focus position and does not adequately enhance sensitivity to the focus position changes of the lithographic printing tool 100. In contrast, unresolved segmentation (e.g., below 30 nm) provides a significant shift in the best focus position, as shown in graph 300, which provides an example for a specific illumination conditions and mask materials.

Figure 4:
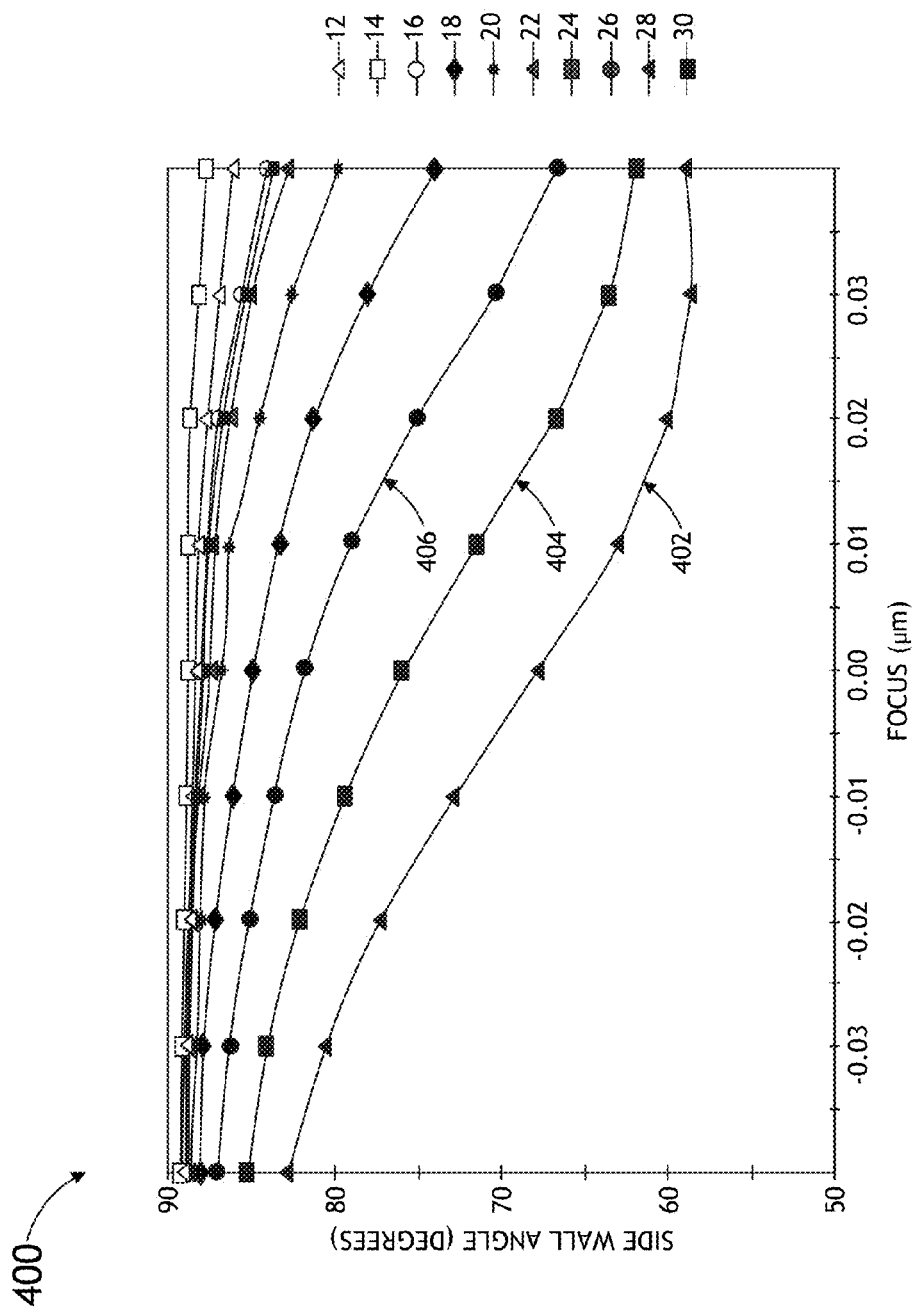
FIG. 4 illustrates a graph of change in side-wall angle as a function of focus position of a lithographic printing for a number of different segmentation pitches, in accordance with one embodiment of the present invention.

FIG. 4 illustrates a graph 400 of the change in side-wall angle (SWA) as a function of focus position of a lithographic printing (e.g., scanner) for a number of different segmentation pitches. The results illustrated in graph 400 were obtained using PROLITH for a 45 nm node stack. As shown, the 12 nm segmentation pitch (curve 402) provides high sensitivity in scanner focus in the range of −40 nm to +10 nm. Further, the 14 nm segmentation pitch (curve 404) provides high sensitivity in scanner focus range in the range −20 nm to +20 nm. In addition, the 16 nm segmentation pitch (curve 406) provides high sensitivity in scanner focus in the range 0 nm to +40 nm. It is noted that in graph 400 the best focus position for devices corresponds to a scanner focus position of zero. The sensitivity in these ranges is approximately 3-4 degrees change in SWA per 10 nm change in scanner focus, which is approximately 4-5 times larger than the sensitivity to scanner focus change associated with targets without segmentation. It is further noted that since the accuracy of a SWA measurement is approximately 1 degree (e.g., for advanced scatterometry tools) it is expected that the accuracy of scanner focus position measurement will be on the order of 3 nm, which is well within the required specification for current systems.

Figure 5B:
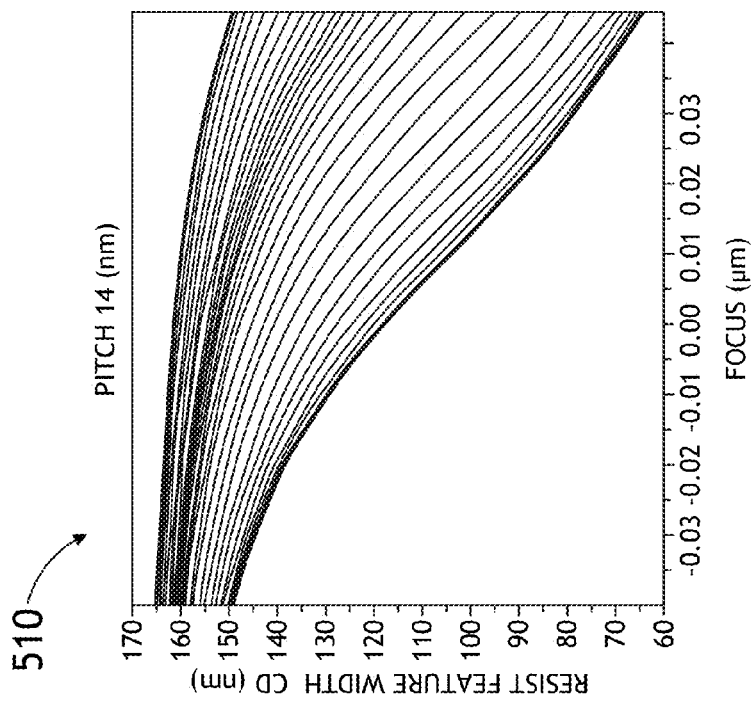
FIGS. 5A and 5B illustrate graphs of the change in side-wall angle at varying topography levels for 12 nm and 14 nm segmentation pitch, in accordance with one embodiment of the present invention.
Figure 5A:
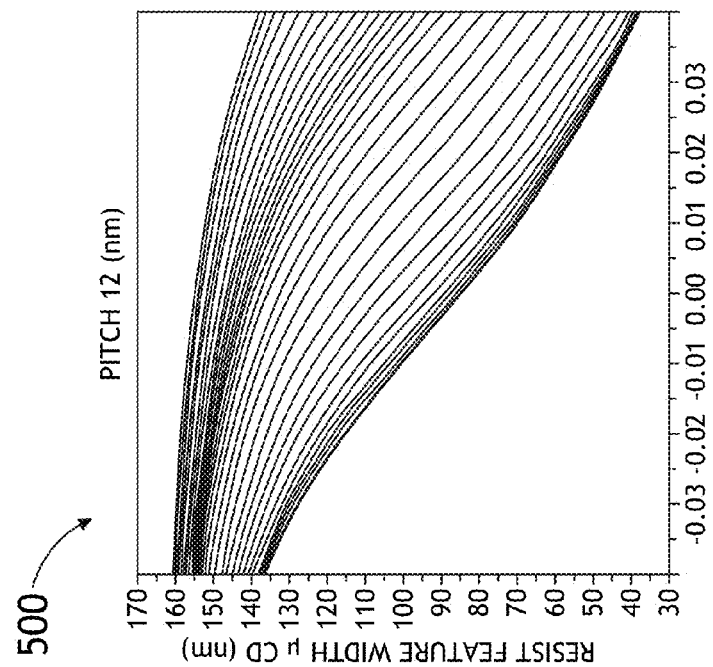

FIGS. 5A and 5B illustrate graphs 500 and 510 of the change in side-wall angle at varying topography levels for 12 nm and 14 nm segmentation pitch. It is noted herein that more accurate results can be obtained (compared to results depicted in FIG. 4) by measuring CD at any chosen topography level (e.g., top CD, bottom CD or middle CD) and/or resist lost. For example, in the case of 12 nm or 14 nm segmentation pitches, a typical CD change is approximately 60-80 nm in the focus range of 80 nm. In the case of middle CD, for example, since the accuracy of middle CD is approximately 1 nm, an accuracy of scanner focus position measurement of approximately 1 nm is expected.

Figures 6A, 6B:
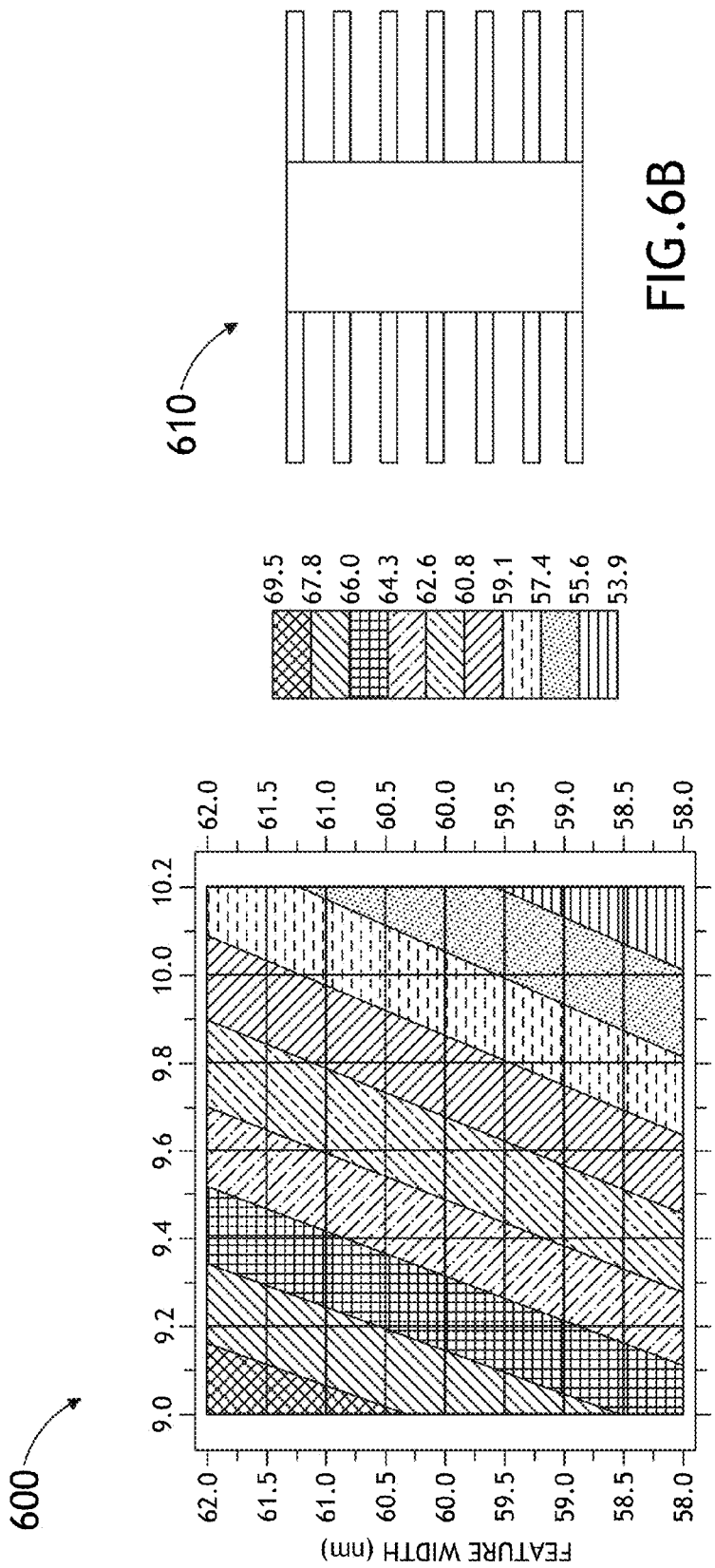
FIGS. 6A and 6B illustrate a multi-cell target with varying segmentation pitch, in accordance with one embodiment of the present invention.

FIGS. 6A and 6B illustrate a multi-cell target with varying segmentation pitch, in accordance with one embodiment of the present invention. A multi-cell target 610, with each cell corresponding to a different segmentation pitch is proposed. For example, a multi-cell target of this nature may be fabricated by printing two or more target cells, with each cell corresponding to a different segmentation pitch. It is recognized that such a target should provide high focus sensitivity in a required scanner focus range. In this regard, the multi-cell target 610 effectively consists of a local focus matrix, where each cell corresponds to effectively different scanner focus position. In a further embodiment, such a target may also include cells corresponding to a different effective exposure values.

Further, an additional cell may mimic dose change by changing mask CD or using unresolved segmentation (e.g., in the direction perpendicular to the grating direction). In this case, the actual amount of light approaching the resist is changed, which is equivalent to changing dose. In FIG. 6A above, the dependence of the printed MCD on the dose change and the mask MCD change is shown. The dependence of dose on segmentation duty cycle for a given printed CD value is almost linear. Applicants note that the simulations provided in FIG. 6A were performed using a commercial lithography package PROLITH. It is noted herein that the x-axis in graph 600 represents exposure measured in mJ/cm2 and the y-axis represents feature width in nm.

It is further recognized that by combining both of the above approaches a "local focus-exposure matrix" may be generated. The local FEM may provide a very sensitive and effective dose and focus measurement option on production wafers. It is noted that the measurement itself implies printing an FEM on test wafer, building models for each one of the cells composing a whole target and then measuring the corresponding properties (e.g., signals, spectra and the like) for each cell on the production wafers. Due to high sensitivity to focus and dose such an approach does not require construction of a complete scatterometry model for printed patterns and may achieve the requirements using only libraries of signals obtained from the FEM wafer.

It is noted herein that an additional critical property of the designed patterns is whether the designed patterns are printable. In the context of the present disclosure "printability" is interpreted as being the ability of a pattern to be well printed in a large range of scanner parameters, such as focus and dose, or at least within the process window for design rule targets, and within an allowable range of process parameters variations.

Figure 7:
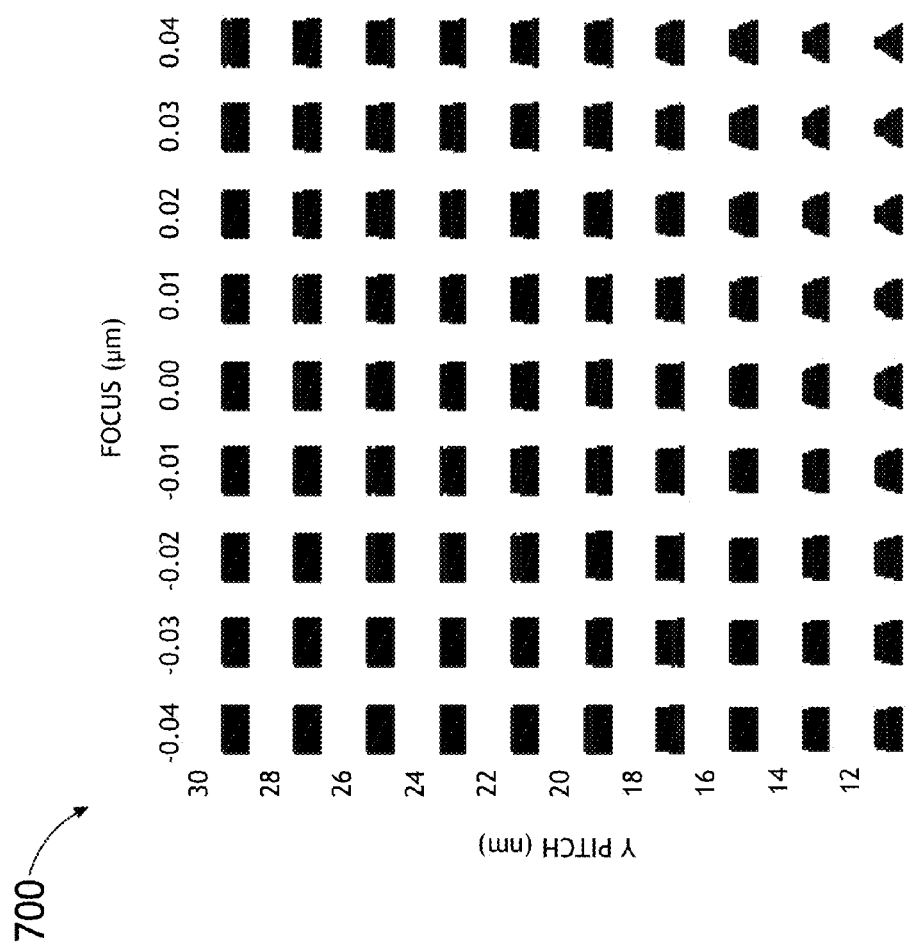
FIG. 7 illustrates a matrix of target profiles as a function of focus and pitch in the y-direction, in accordance with one embodiment of the present invention.

FIG. 7 illustrates a matrix of target profiles as a function of focus and pitch in the y-direction. As shown in FIG. 7, in some instances the added feature of high sensitivity to changes in scanner focus (e.g., small pitch segmentation)

may lead to difficulty in terms of target printability in the relatively large scanner focus range. In one embodiment, in order to meet the challenges of printability for segmentation pitches 12 nm and 14 nm in the range of positive scanner focus positions a lithography package (e.g., PROLITH) may be utilized to provide an optimal design for a given range of scanner parameters or to print a test wafer with a variety of different target designs. In another embodiment, an additional assist feature may be utilized to make the printed pattern more robust.

In order to overcome the printability problems associated with patterns having a high level of sensitivity to the scanner focus changes, a new target design procedure consisting of 2D structures is proposed, which is well printable in one direction and very sensitive to scanner focus changes in perpendicular direction.

In a first step, a one-dimensional target may be designed, which is well printable (i.e., printable with a desired level of success) in an allowable range of selected scanner parameters and process variations. In this regard, the designed target may include, but is not limited to, an isolated line printed with or without assist features. In another embodiment, the designed target may include, but is not limited to, a periodic pattern with design rule pitch or another pitch. For example, in many cases, a periodic pattern with design rule pitch provides a robust target design within the required process window. In another embodiment, the design of a one-dimensional target may be carried out, at least in part, with a lithographic simulation tool (e.g., PROLITH). Alternatively, the design of a one-dimensional target may be based on trial and error with the with the process optimization for any selected process.

In a second step, an infinite line may be cut from both ends of the line of the first step. In this regard, a finite line with the length of more than the scale defined in the first step is provided. In a third step, one or more assist features (see 802 and 812 of FIGS. 8A and 8B) may be added to one end of the line or to both ends of the line in order to increase the sensitivity to scanner focus changes. It is further noted that an entire target may consist of a single structure or a combination of single structures corresponding to the different design steps described above.

Figure 8B:
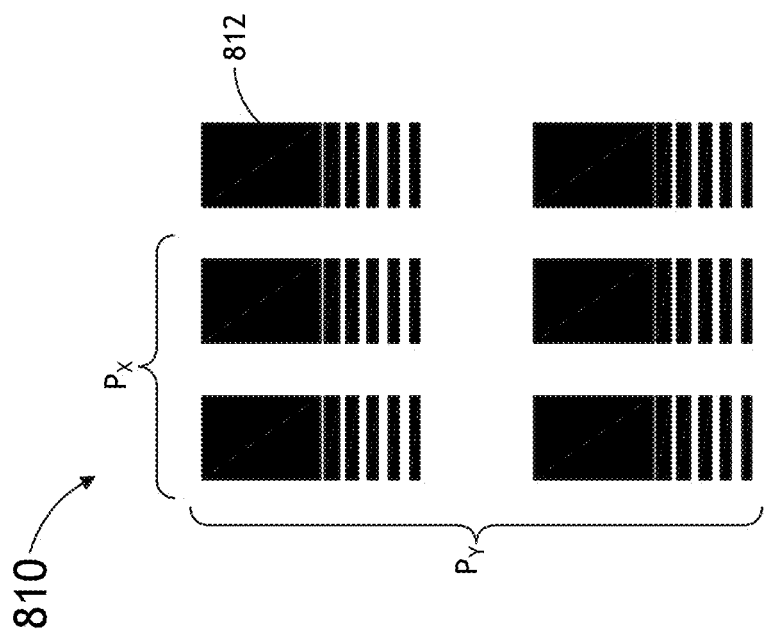
FIG. 8B illustrates a designed target with asymmetric assist features, in accordance with embodiments of the present invention.
Figure 8A:
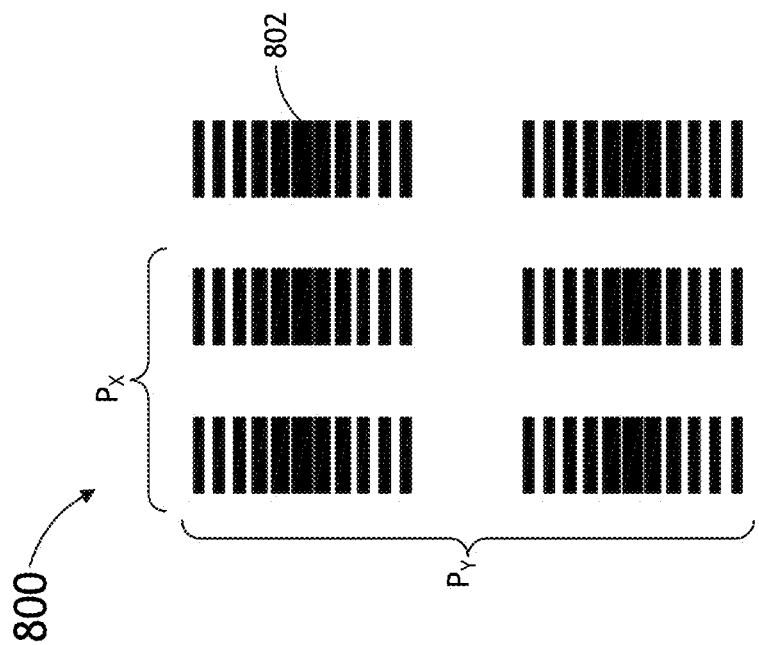
FIG. 8A illustrates a designed target with symmetric assist features, in accordance with embodiments of the present invention.

FIGS. 8A and 8B illustrate the designed targets 800, 810 with symmetric and asymmetric assist features, respectively, in accordance with embodiments of the present invention. It is noted herein that as a result of the target design process described above a satisfactory printable two-dimensional structure with high sensitivity to scanner focus changes is achieved. It is further noted that the sensitivity to scanner focus change is enhanced via the assist features located at the ends of each line of the target pattern. For example, as shown in FIG. 8A, a target design 800 with symmetric assist 802 features located at the ends of each line is provided. By way of another example, as shown in FIG. 8B, a target design 810 with asymmetric assist 812 features located at the ends of each line is provided. It is further noted that the target designs in FIGS. 8A and 8B are periodic in both the x-direction (e.g., pitch of Px) and the y-direction (e.g., pitch of Py). It is further noted that the utilization of assist features in the target design may allow for the implementation of additional measurement methods, described in more detail further herein.

FIG. 9 illustrates the calculated Y-profiles of the printed targets, such as targets 800 and 810, for different scanner focus positions, in accordance with one embodiment of the present invention. In one embodiment, the Y-profiles 900 depicted in FIG. 9 may be calculated with a lithography package, such as, but not limited to, PROLITH. As shown in FIG. 9, the depicted Y-profiles correspond to a scanner focus position of −0.02, 0 and +0.02 μm. It is noted herein that in addition to good printability a change of the printed structure length in the x-direction (e.g., approximately 30-40 nm) in the scanner focus range ±40 nm is achieved. Moreover, the CD change displays monotonic behavior within this scanner focus range.

The present invention is further directed to a method and system for measurement of one or more lithographic production parameters. For example, production parameters in the context of this disclosure may include, but are not limited to, focus. It is noted, however, that the following description may be applied to any scanner or track parameter known in the art.

It is noted herein that the response of targets to changes in focus may be measured using a variety of scatterometry approaches, which may include full electromagnetic modeling. It is further recognized, however, as observed in FIG. 9, the widely used trapezoid approximation that includes only 3 parameters (middle CD, resist height and side-wall angle) is not readily applicable to the physical profiles of the printed structures. Moreover, use of such approximation leads to the (i) mixing of the effects of dose change and focus change on selected profile parameters; and (ii) disallows proper measured signal modeling (e.g., solving the inverse problem, namely recovering the value of the focus from the measured signal) based on full electromagnetic simulation.

Figure 10:
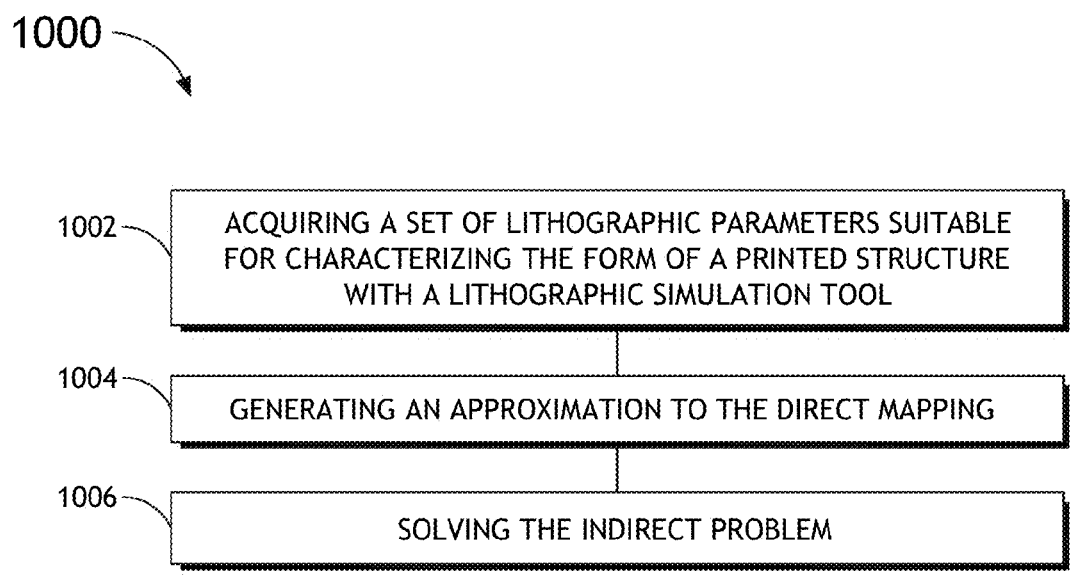
FIG. 10 is process flow diagram illustrating steps performed in a method for measuring production parameters in a lithographic process, in accordance with an embodiment of the present invention.
Figure 11:
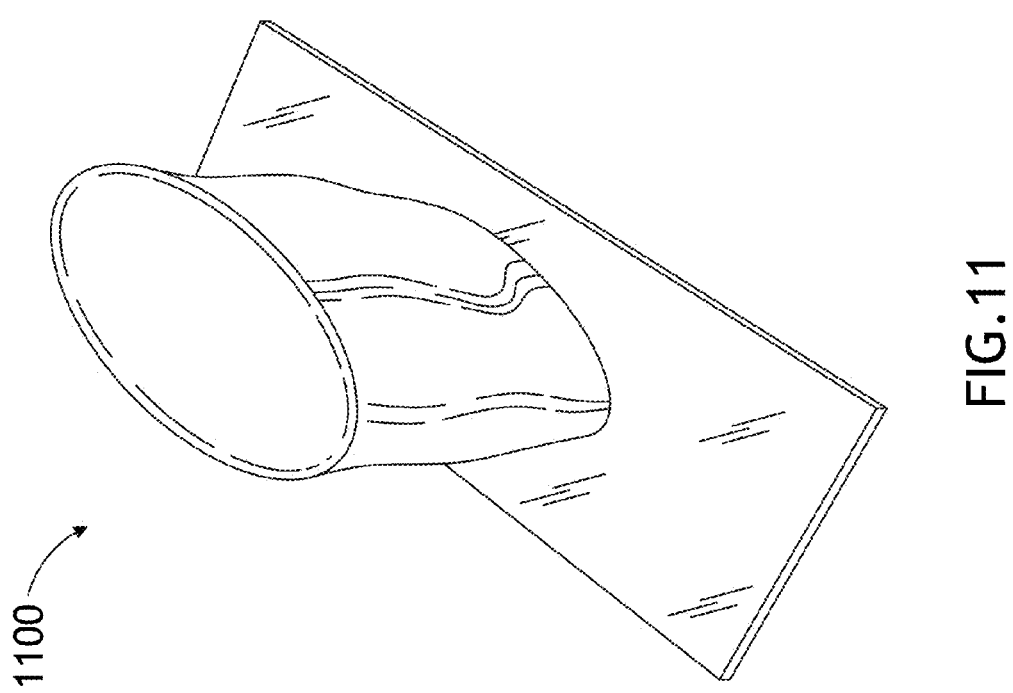
FIG. 11 illustrates the three-dimensional structure of a printed target, in accordance with one embodiment of the present invention.

FIG. 10 is process flow diagram illustrating steps performed in a method 1000 for measuring production parameters in a lithographic process, in accordance with an embodiment of the present invention. It is noted herein that method 1000 may be carried out using any lithography, metrology and/or computational architecture known in the art. For example, one or more steps of method 1000 may be carried out utilizing one or more systems 100, 120, 140 or 160 described previously herein.

In step 1002, a set of lithographic parameters suitable for characterizing the form of a printed structure is acquired with a lithographic simulation tool. In one embodiment, the form, or profile, of the printed structure as a function of the scanner parameters (e.g., focus and exposure) may be extracted using a lithographic simulation tool (e.g., PROLITH). It is noted herein that the profiles for each of the printed structures may be utilized for modeling. It is further noted that all the plurality of the forms of the printed structures may be described by a relatively small number of physically meaningful parameters, such as, focus and dose or other scanner and track parameters.

As shown by the form of three-dimensional structure 1100 in FIG. 1100, it is not possible to describe the illustrated three-dimensional geometry of this type of structure with a small number of geometric parameters, which describe the printed structure with a high level of accuracy. The present invention improves over this approach by utilizing a small number of primary floating parameters. These parameters should have relevant physical meaning during the lithographic printing process. Further, the present embodiment allows for only these parameters to be utilized during the solution of the direct and inverse problem.

In step 1004, an approximation of the direct mapping from the production parameters in a lithographic process (e.g., focus and dose) to the measured signals and/or an approximation of the inverse mapping from the measured signals to the production parameters in a lithographic process are generated.

Let F be the domain of the possible foci, D be the domain of the possible exposures, $P_1, \ldots, P_n$ be the domains of the variation of the parameters responsible for process variations and S be the variety of the possible measured signals. The direct and inverse mappings are provided by the following:

$$T: (F, D, P_1, \ldots, P_n) \ni (f, d, p_1, \ldots, p_n) \to s \in S \qquad \text{Eq. 1}$$

$$T^{-1}: S \ni s \to (f, d, p_1, \ldots, p_n) \in (F, D, P_1, \ldots, P_n) \qquad \text{Eq. 2}$$

It one embodiment, an approximation to the direct mapping and/or inverse mappings of Eq. 1 and Eq. 2 may be generated using rigorous simulations of printing and measurement processes, artificial intelligence techniques, statistical learning techniques, or the like.

It is noted herein that the construction of the approximation of the inverse mapping may be based on the knowledge of the direct mapping (e.g., the regression method), any technique for an inverse problem solution, such as the factorization method, the linear sampling method and the like, or by applying empirically learned data (e.g., measurements of the FEM wafer).

In step 1006, the indirect problem is solved. For example, using the inverse mapping constructed in step 1004, the inverse problem may be solved (i.e., the measurement is accomplished). In this regard, for example, the focus and dose are recovered.

It is noted here that the direct problem may be solved in an analogous manner. More generally, at least one of the direct problem and/or the indirect problem may be solved utilizing the above mappings.

Figure 12A:
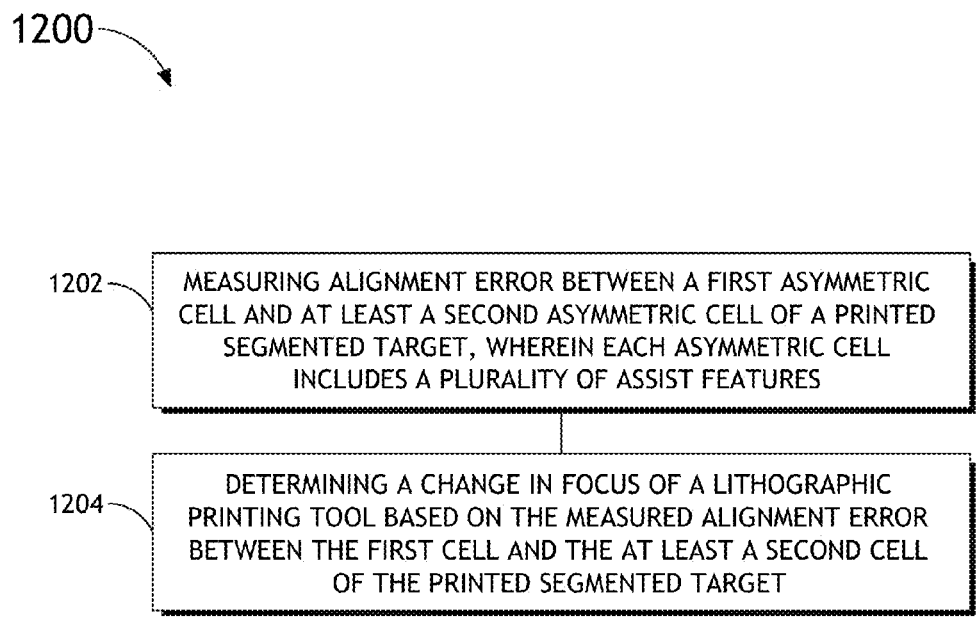
FIG. 12A is a process flow diagram illustrating steps performed in a method for measuring focus changes in a lithography printing device, in accordance with an embodiment of the present invention.

FIG. 12A is a process flow diagram illustrating steps performed in a method 1200 for measuring focus changes in a lithography printing device, in accordance with an embodiment of the present invention. It is noted herein that method 1200 may be carried out using any lithography, metrology and/or computational architecture known in the art. For example, one or more steps of method 1200 may be carried out utilizing one or more systems 100, 120, 140 or 160 described previously herein.

Figure 12B:
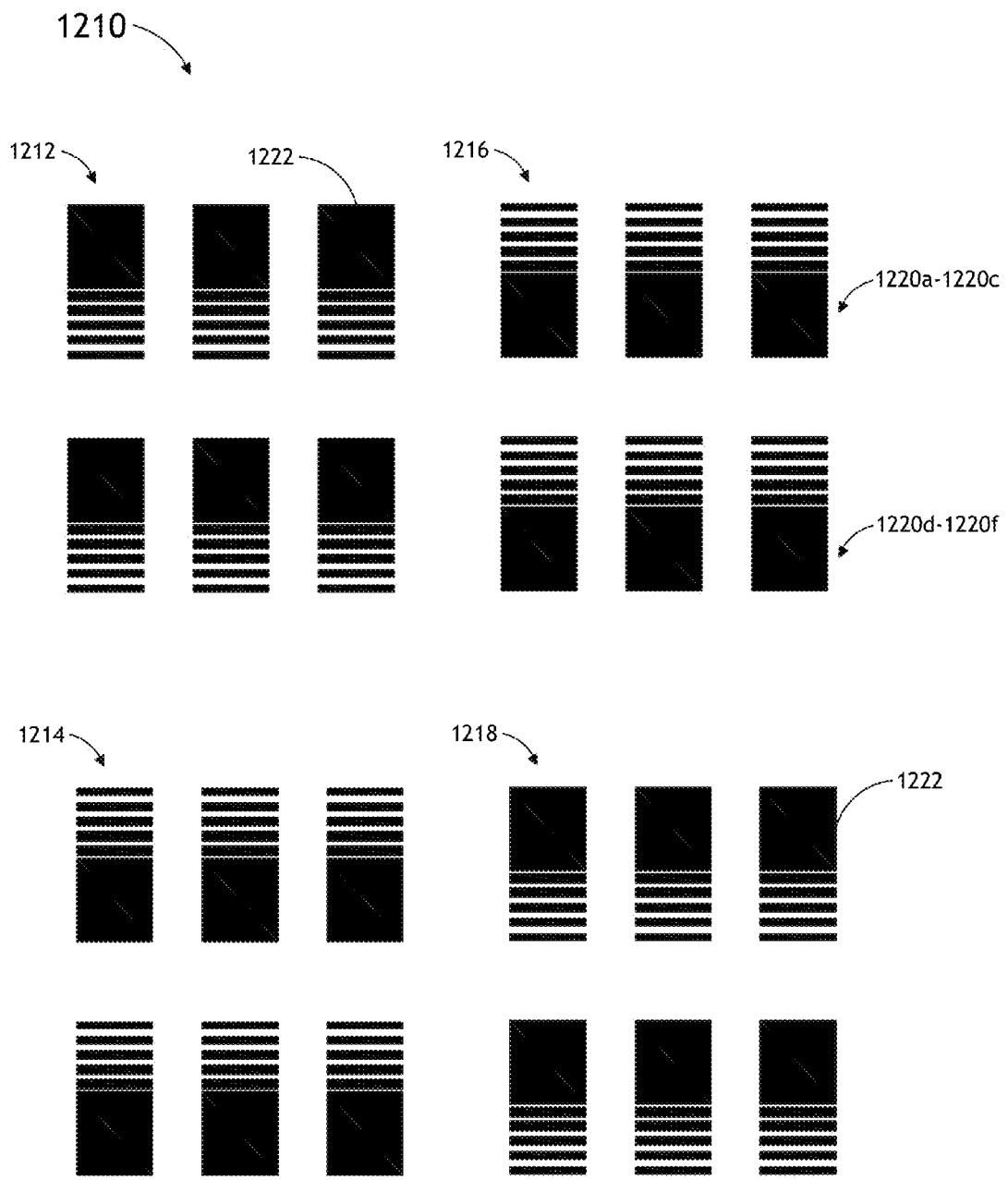
FIG. 12B illustrates an entire target including four asymmetric cells, in accordance with an embodiment of the present invention.

In step 1202, an alignment error between a first cell and at least a second cell of a printed segmented target is measured. FIG. 12B illustrates an entire target 1210 including four asymmetric cells 1212, 1214, 1216 and 1218. In one embodiment, each of the asymmetric cells 1212, 1214, 1216 and 1218 includes a set of structures. For example, asymmetric cell 1212 includes segmented structures 1220a-1220f. In another embodiment, each structure of each cell may be equipped with an assist feature 1222. It is noted herein that changes in focus of the lithographic printing tool 100 (e.g., scanner) may manifest themselves as alignment errors between two or more of the cells of target 1210 (or an equivalent thereof).

In step 1204, a change in focus of a lithographic printing tool is determined based on the measured alignment error between a first cell and at least a second cell of a printed segmented target. It is noted herein that alignment error between cells of target 1210 may be measured using an overlay metrology tool. In one embodiment, an alignment error between a first cell and at least a second cell of a printed segmented target is measured with a metrology tool (e.g., metrology tool 120). For example, the metrology tool used to measure alignment error between at least two cells of target 1210 may include, but is not limited to, an imaging overlay measurement tool, a scatterometry overlay measurement tool and the like.

For example, due to a change in scanner focus cell 1212 and cell 1218 are shifted down, while cell 1216 and cell 1214 are shifted up. For instance, the relative shift measured by an OVL tool may be approximately 20-30 nm for a scanner focus range of ±40 nm. It is further noted that this relative shift displays monotonic behavior with respect to scanner focus change.

Figure 12C:
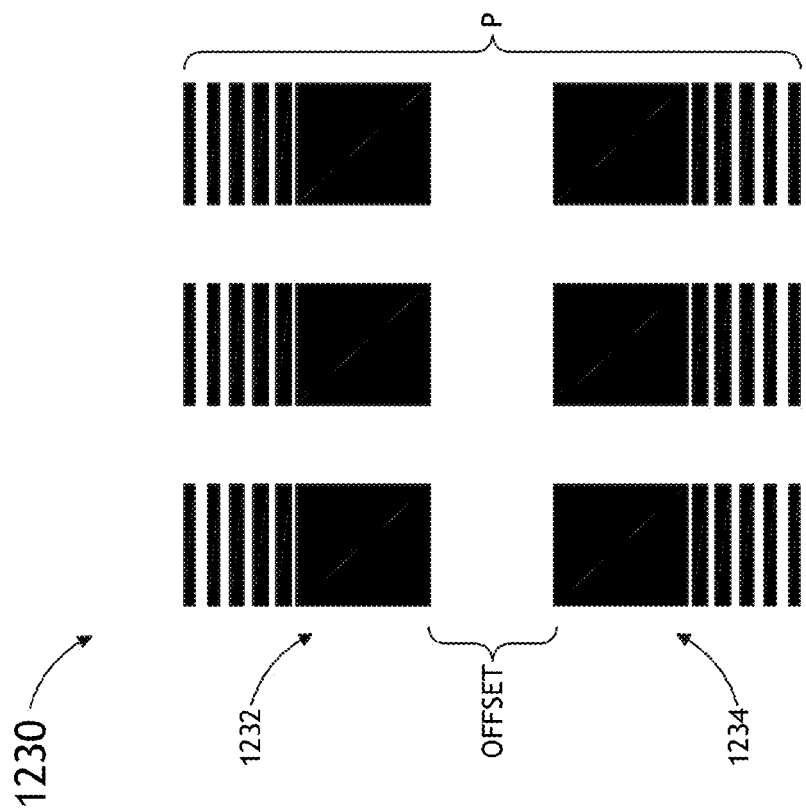
FIG. 12C illustrates a target design suitable for determining a change in focus of a lithographic printing tool using measurements from a scatterometry overlay metrology tool, in accordance with one embodiment of the present invention.

FIG. 12C illustrates a target design 1230 suitable for determining a change in focus of a lithographic printing tool using measurements from a scatterometry overlay metrology tool, in accordance with one embodiment of the present invention. In one embodiment, the target period 1230 includes two cells 1232 and 1234 in which a pitch (P) is provided along the y-direction structures. It is noted the structures may consist of two gratings with alternating location of assist features and a predefined offsets between them, as shown in FIG. 12C.

It is noted herein that the shift/offset between two gratings in the x-direction does not impact the result of overlay measurements in the y-direction if the pitch in the x-direction is unresolved by the given measurement tool. It is further recognized that one of the gratings by an amount of one half the pitch (P) (or any other value).

In another embodiment, the targets (e.g., 1210 or 1230) may be printed with a selected number of cells, with each cell corresponding to a different pitch and/or the main line-to-space ratio. In another embodiment, each cell may correspond to a different segmentation pitch and/or line-to-space ratio.

Further, since the dependency of the resulting grating on the different parameters of the lithographic process may vary from one cell to another, the usage of more than one cell signal measurement may provide for decorrelation of the signal dependencies on focus, dose and other parameters. This decorrelation may lead to a significant improvement in both accuracy and repeatability of the measurement.

It is noted herein that there are two main scatterometry based approaches for focus and dose measurement. These include the (i) full modeling approach (i.e., FEM free approach) and the (ii) FEM based modeling approach (i.e., full modeling free approach). In the first case, it is possible to calculate a few basic characteristics of the printed pattern which are matched to the focus and dose values based on measured signal. The main advantage of this approach is that it allows elimination of process variations effects by treating the meaningful process parameters as floating parameters. The main disadvantage of this approach is its complexity, even for very simple printed gratings, such as design rule gratings. In addition, application of full modeling to three-dimensional targets or to any two-dimensional non-design rule gratings, which are sensitive to scanner focus changes, is problematic due to the fact that sensitivity to scanner focus position is directly connected to the complex geometrical form of the printed patterns, which cannot be described with only a few geometrical parameters. The second approach involves printing a special FEM wafer and generating a library of signals corresponding to different focus and dose values. Computationally, this approach is much easier, but suffers from process variations, which are not taken into account when the model describing a matching between signals and measured focus and dose values is established.

An intermediate approach is proposed in accordance with the present disclosure and will be referred to herein as "partial modeling." Method and systems for the partially modeling process of the present disclosure including printing target a consisting of a small number of cells (e.g., 2 to 10 cells), where a portion of the cells of the target correspond to targets sensitive to focus, whereas another portion of the cells (e.g., one or two cells) consist of "basic" cells. The basic cells may be constructed without a grating or line-space structure having a minimal design rule pitch. As such, the basic cells may be adequately described utilizing simple modeling processes.

Figure 13:
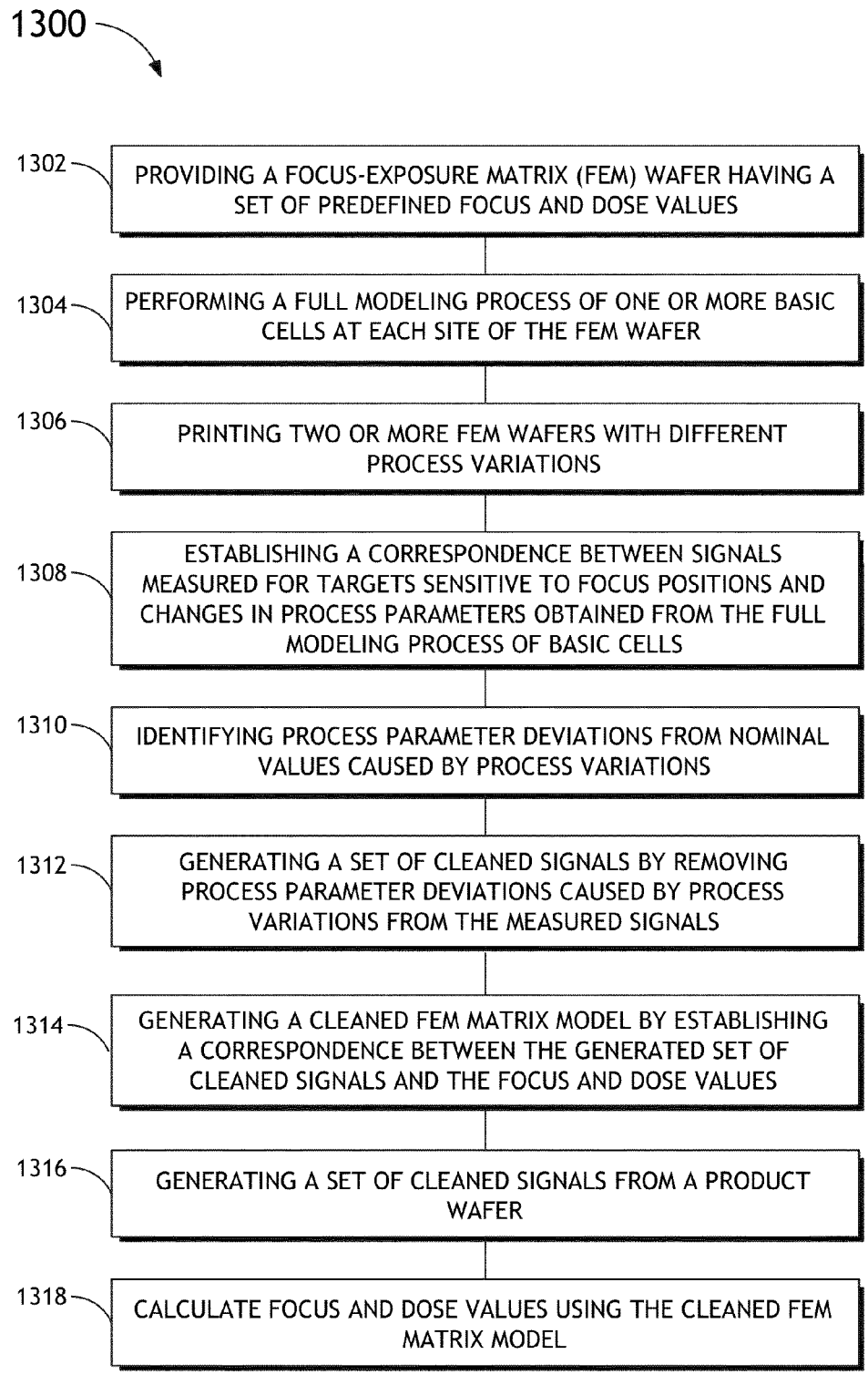
FIG. 13 is a process flow diagram illustrating steps performed in a method of a partial modeling process, in accordance with an embodiment of the present invention.
Figure 14:
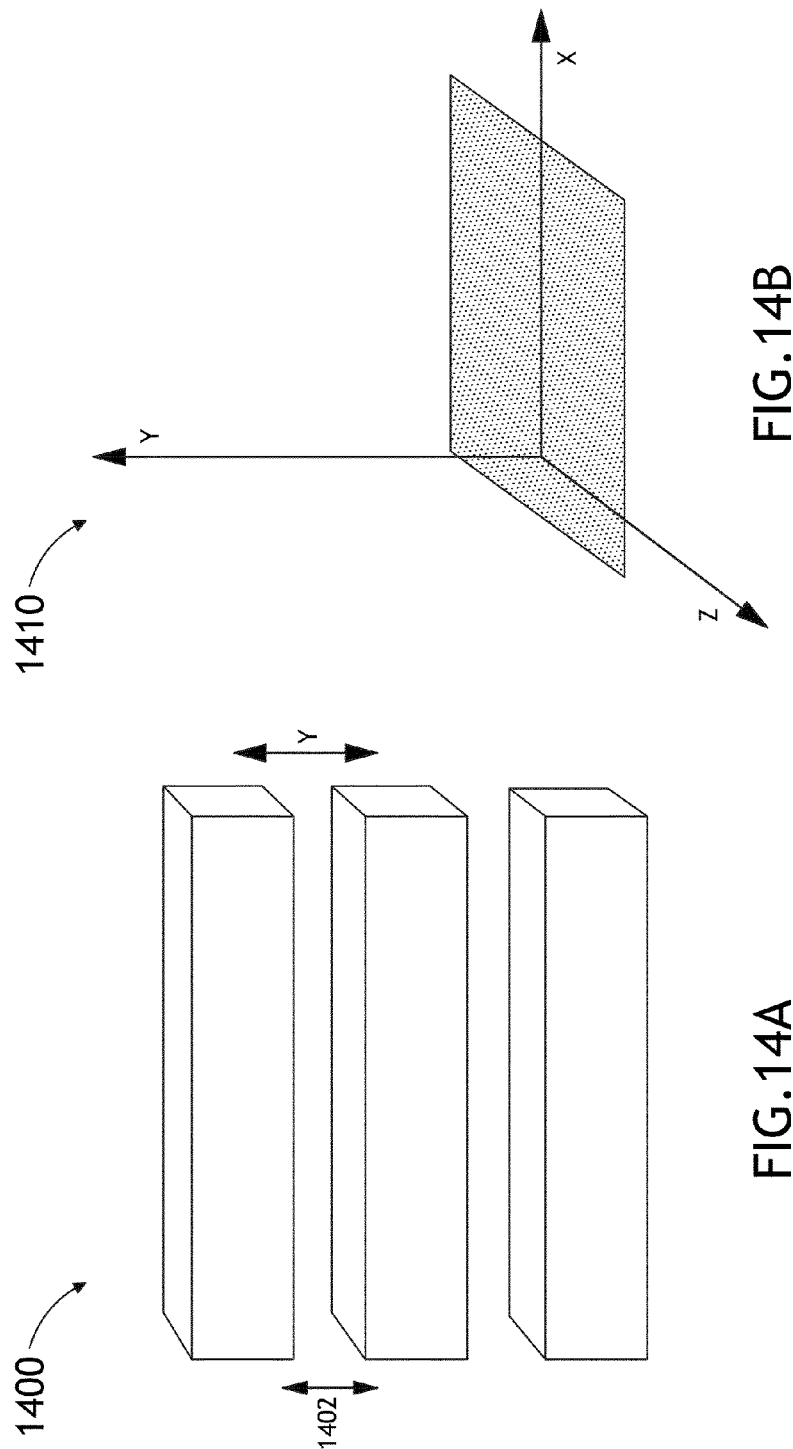
FIGS. 14A and 14B depict an additional conceptual view of a segmented mask with unresolved pitch, in accordance with an embodiment of the present invention.

FIG. 13 is a process flow diagram illustrating steps performed in a method 1300 of a partial modeling process, in accordance with an embodiment of the present invention. It is noted herein that method 1300 may be carried out using any lithography, metrology and/or computational architecture known in the art. For example, one or more steps of method 1200 may be carried out utilizing one or more systems 100, 120, 140 or 160 described previously herein.

In step 1302, a focus-exposure matrix (FEM) wafer having a set of predefined focus and dose values is provided. In step 1304, a full modeling process of one or more basic cells at each site of the FEM wafer is performed. For example, at each site on a FEM wafer with predefined focus and dose values a full modeling of a basic, or "simple," cells (e.g., are films or/and design rule gratings).

In step 306, two or more FEM wafers with different process variations are printed. In step 1308, a correspondence between signals measured for targets sensitive to focus positions and changes in process parameters obtained from the full modeling process of basic cells is established. For example, two or more FEM wafer may be printed with process variations, which appear naturally and establish a correspondence between signals measured for targets sensitive to focus positions and changes in process parameters obtained from full modeling of simple targets described in step 1302.

In step 1310, process parameter deviations from nominal values caused by process variations are identified. For example, derivatives and deviations of the measured signals (for focus sensitive targets) with respect to meaningful process parameters may be defined.

In step 1312, a set of "cleaned" signals for focus sensitive targets is generated by removing process parameter deviations caused by process variations from the measured signals. For example, utilizing the found derivatives and deviations of process parameters from their nominal values measured signal may be "cleaned" from deviations caused by process variations.

In step 1314, a cleaned FEM matrix model is generated by establishing a correspondence between the generated set of cleaned signals and the focus and dose values.

In step 1316, a set of cleaned signals is generated from a product wafer. In step 1318, focus and dose values are calculated using the cleaned FEM matrix model For example, the cleaning procedure described above may be applied to the product wafer (using measured on product wafer values of process parameters), while focus and dose values are calculated using the FEM wafer based model.

FIGS. 14A and 14B depict an additional conceptual view of a segmented mask 1400 with unresolved pitch, in accordance with an embodiment of the present invention. It is noted herein that the optical properties of materials constructed from substructures having sizes much smaller than the illumination wavelength may be changed dramatically. Moreover, materials fabricated in this manner may respond to different light polarizations in different manners.

In the example depicted in FIGS. 14A and 14B, it is assumed that the illumination plane of incident light coincides with the plane 1410 constructed by two of the main axes of the target plane. In one embodiment, the effective permittivity of mask 1400 (e.g., chrome mask) segmented with unresolved pitch 1402 is describable via the effective medium approximation. The effective medium approximation shows that such a segmented feature is effectively equivalent to an anisotropic film with the following directional permittivity vector:

$$\varepsilon_x = \varepsilon_z = \frac{\varepsilon_1 + \eta\varepsilon_2}{1+\eta} \qquad \text{Eq. 3}$$

$$\varepsilon_y = \frac{\varepsilon_1 \cdot \varepsilon_2 (1+\eta)}{\varepsilon_2 + \eta\varepsilon_1} \qquad \text{Eq. 4}$$

Where $\in_1$ is the permittivity of a first material, such as chrome, $\in_2$ is the permittivity of a second material, such as air, and $\eta$ is the duty cycle of the segmentation in the y-direction. Applicants note that estimates indicate that for different values of the segmentation duty cycle, the "flat part" of the dependence of different characteristics of the printed pattern on lithography printing tool 100 focus position can be shifted by up to 100 nm.

FIG. 1500 depicts a conceptual view of a one-dimensional target 1500 sensitive to the focus of a lithographic printing tool 100 (e.g., scanner), in accordance to one embodiment of the present invention. In one embodiment, one periodic region of the mask associated with the target 1500 can be divided into N regions. In another embodiment, at least some of the N regions may differ in area and in shape (e.g., rectangular shapes or non-rectangular shapes). In another embodiment, at least some of the N regions may possess different light transmittance properties. For instance, the light transmittance properties of the N regions may differ due to different wafer topography and utilized materials. In another instance, the light transmittance properties of the N regions may differ due to the segmentation with different duty cycles.

Figure 15:
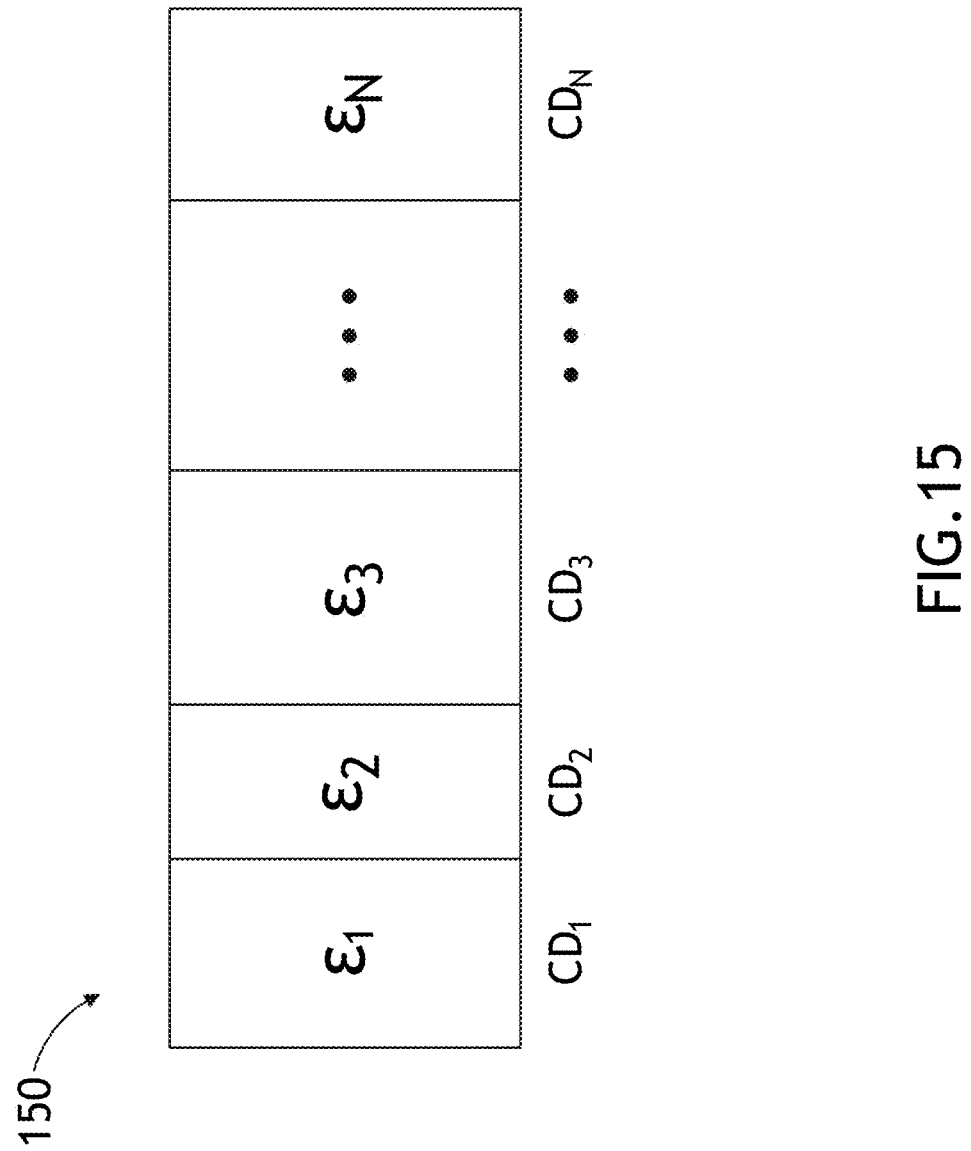
FIG. 15 depicts a conceptual view of a one-dimensional target sensitive to the focus of a lithographic printing tool, in accordance to one embodiment of the present invention.

For example, as shown in FIG. 15, region 1 may have a permittivity of $\in_1$ and a width CD1, region 2 may have a permittivity of $\in_2$ and a width $CD_2$, region 3 may have a permittivity of $\in_2$ and a width $CD_2$ and so on, up to and including region N, which may have a permittivity of $\in_N$ and a width $CD_N$. Further, the width, pitch, duty cycles and effective permittivity, which may be different for each polarization, associated with the regions may define the amplitudes and phases of diffraction orders allowing for improved sensitivity of the printed pattern to lithography printing tool 100 in a focus range within a selected process window.

It is noted herein that the mask pattern 200 depicted previously in FIG. 2 represents a simplified embodiment of the generalized model described above. In the case of mask pattern 200, the pattern includes a simple two component mask pattern, whereby solid material features 202 (e.g., chrome features) alternate with void areas of air 204 (or other gases in the case of a back-filled process chamber) at a pitch Py in the y-direction and each pattern 206 is repeated along the x-direction at a pitch of Px.

Figure 16:
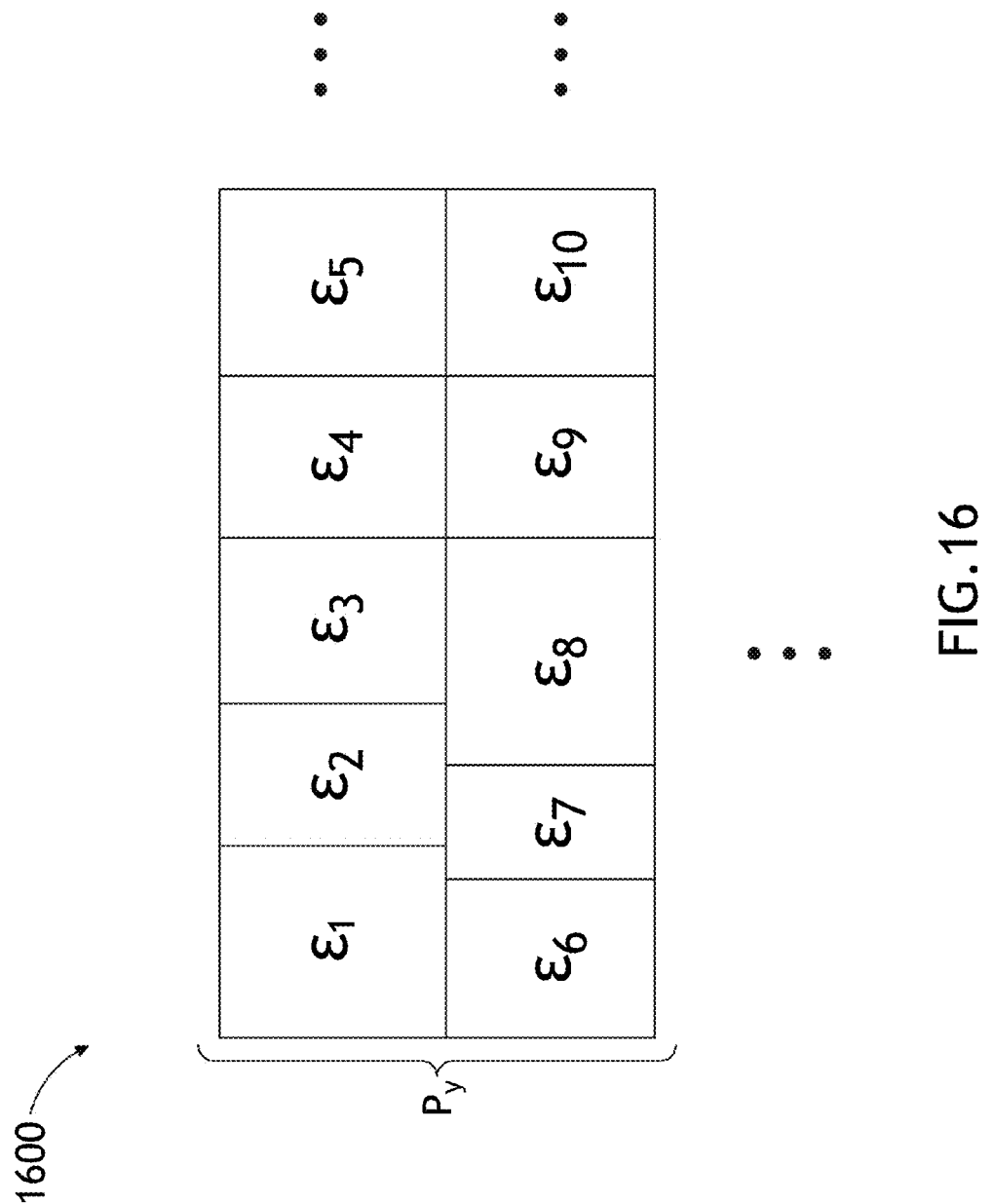
FIG. 16 illustrates a conceptual view of a generalized two-dimensional printed target design, in accordance with one embodiment of the present invention.

FIG. 16 illustrates a conceptual view of a generalized two-dimensional printed target design, in accordance with one embodiment of the present invention. In one embodiment, a two-dimensional printed pattern 1600 may be constructed from different elements of one-dimensional structures (e.g., one-dimensional structure as shown in FIG. 15) with additional resolved pitch in one direction (e.g., Y-direction in FIG. 16). Accordingly, in order to generate a target having adequate focus sensitivity (e.g., sensitivity above a desired threshold or an optimized sensitivity) a variety of combinations of substructures within the two-dimensional area corresponding to a certain period in the x-direction and a certain (possibly different) period in the y-direction may be considered.

FIGS. 17A and 17B illustrate a symmetric mask design utilizing more than two different regions per period, in accordance with one embodiment of the present invention. It is noted herein that the mask design 1700 of FIG. 17A provides adequate flexibility to achieve a desired level of improvement in sensitivity of the corresponding printed pattern to lithography printing tool (e.g., scanner) focus. The illustrated region of design 1700 corresponds to one period in x- and y-directions. For instance, in the example illustrated, a resolved pitch may be used in the x-direction, with an unresolved pitch in the y-direction. For instance, the unresolved pitch in the y-direction may be 60 nm on the wafer (240 nm pitch on mask in case of a demagnification ratio of 4), with the resolved pitch along the x-direction being 140 nm and the minimal size of each substructure being 15 nm. Further, the spatial profile of a printed line of the target corresponding with the mask design 1700 is shown in graph 1710 of FIG. 17B. It is noted herein that the design 1700 depicted in FIGS. 17A and 17B is for illustrative purposes only and the specific arrangement and values described above is not limiting.

Figure 17D:
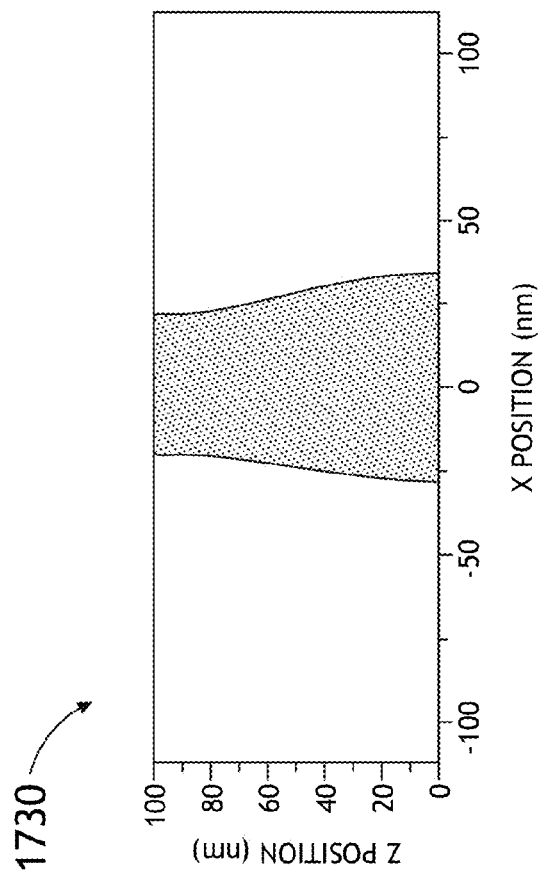
FIGS. 17C and 17D illustrate an asymmetric mask design utilizing more than two different regions per period, in accordance with one embodiment of the present invention.
Figure 17C:
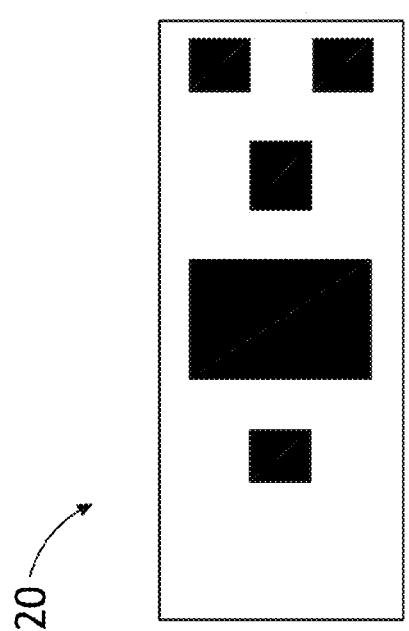

FIGS. 17C and 17D illustrate an asymmetric mask design utilizing more than two different regions per period, in accordance with one embodiment of the present invention. The illustrated region of design 1720 corresponds to one period in x- and y-directions. For instance, in the example illustrated in FIG. 17C, a resolved pitch may be used in the x-direction, with an unresolved pitch in the y-direction, although this should not be interpreted as a limitation. It is noted herein that the asymmetry of the mask 1730 combined with the mask topography provide additional knobs for controlling the phase shifts between different diffraction orders. It is further recognized herein that, in addition to the segmentation characteristics, the positions of substructures relative to each other may also impact the resulting light intensity profile. For example, the relative shift of segmented lines in the y-direction changes the effective medium characteristics for x-polarization and vice versa.

Figure 18A:
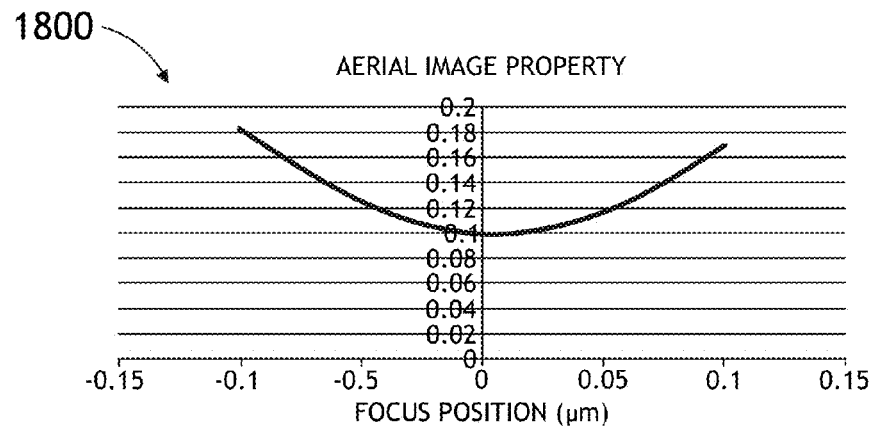
FIGS. 18A-18C illustrate a series of aerial image intensity data sets at the middle of target periodic pattern, in accordance with one embodiment of the present invention.
Figure 18B:
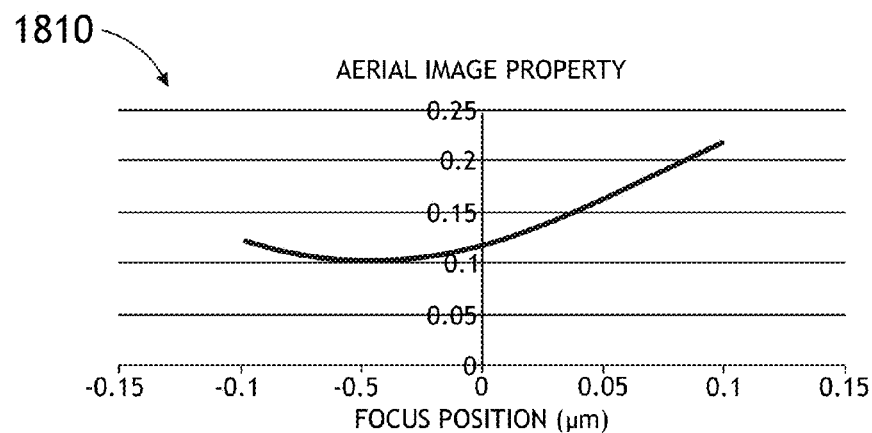
Figure 18C:
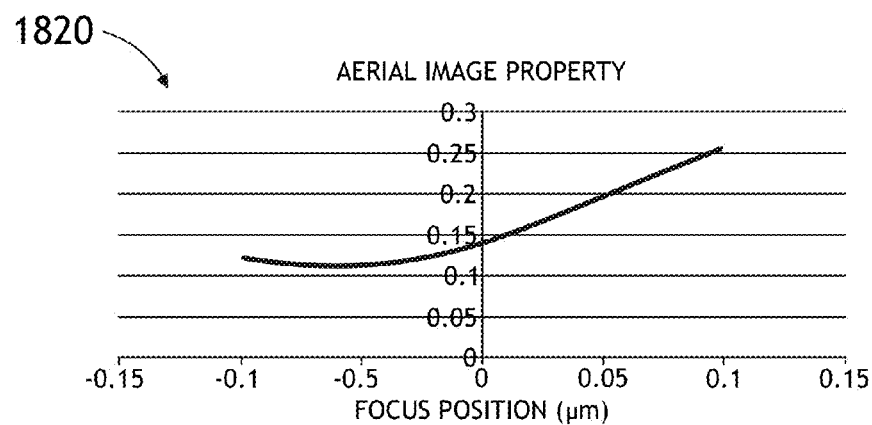
Figure 18D:
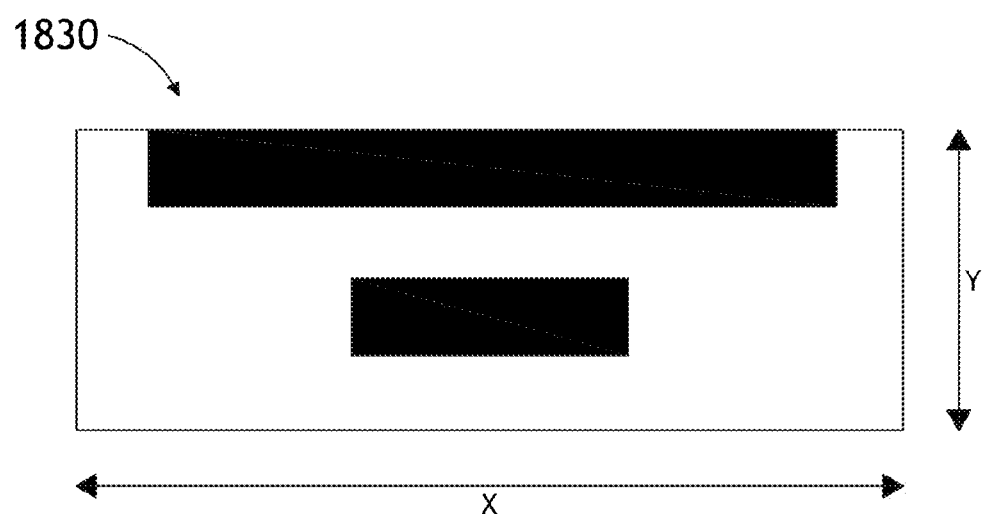
FIG. 18D illustrates one periodic fragment of a phase target, in accordance with one embodiment of the present invention.

FIGS. 18A-18C illustrate a series of aerial image intensity data sets at the middle of target periodic pattern, in accordance with one embodiment of the present invention. FIG. 18A illustrates a graph 1800 of the aerial image intensity as a function of focus position for a standard attenuated mask. The mask used to generate graph 1800 corresponds to a standard line mask. FIG. 18B illustrates a graph 1810 of the aerial image intensity as a function of focus position for a shift mask providing $\pi/2$ phase shift. The mask used to generate graph 1810 corresponds to a space mask. FIG. 18C illustrates a graph 1820 of the aerial image intensity as a function of focus position for a designed phase target without change of the mask topography in accordance with the present invention. One periodic fragment 1830 of the phase target used to generated graph 1820 is depicted in FIG. 18D. Note that the shown fragment of the mask corresponds to one pitch (resolved) in the x-direction and a small (unresolved) pitch in the y-direction.

It is noted herein that the minimum aerial image intensity corresponds to the maximum CD of the given printed line. As shown in FIGS. 18A-18C, the minimum of the aerial image intensity in the case of the attenuated shift mask (graph 1800) is in the best focus position (i.e., zero focus position, which corresponds to the scanner focus position used on product wafers). In contrast, both the phase shift mask (graph 1810) and the designed phase targets shift the position of minimum intensity by approximately 50-70 nm, which significantly increases the sensitivity of the printed target to changes in scanner focus position in the focus range about the zero focus position.

The present invention is further directed to methods and systems for determining one or more mask designs suitable for creating printed patterns sensitive to focus. It is noted herein that one or more processors may be configured to execute program instructions stored in a non-transitory memory medium. In this regard, the one or more processors may carry out any of the data processing, computation or data transfer steps described throughout the present disclosure. For example, the computational systems or sub-systems associated with system 100, 120, 140 and/or 160 may be utilized to carry out one or more of the computational steps described herein.

It is noted herein that the number of parameters that can be varied in order to optimize (or at least improve beyond a selected threshold) sensitivity to focus, according to the present invention, can be very large. In one embodiment, the present invention includes a simulation tool for acquiring an adequate level of sensitivity to focus. In one embodiment, the simulation tool may be equipped with lithography simulation capabilities (e.g., PROLITH). In another embodiment, the simulation tool is configured to optimize, or achieve beyond a desirable threshold, a target design based on a cost function. The cost function may maximize sensitivity, or at least achieve sensitivity beyond a desired threshold, to focus, while ensuring printability of the target. It is noted that this simulation tool may use, for example, any approach known in the art varying parameters. For instance, the simulation tool may implement a simulated annealing process or a conjugate gradient as an optimization algorithm. In another embodiment, the optimization (or achievement of a target design satisfactory to achieve desired focus sensitivity) is carried separately for each mask stack, wafer stack, scanner illumination definition and etc. It is further noted that the above consideration relates to the possibility of designing targets sensitive to focus variations within a given range of focus positions (e.g., about the best focus position).

Figure 19A:
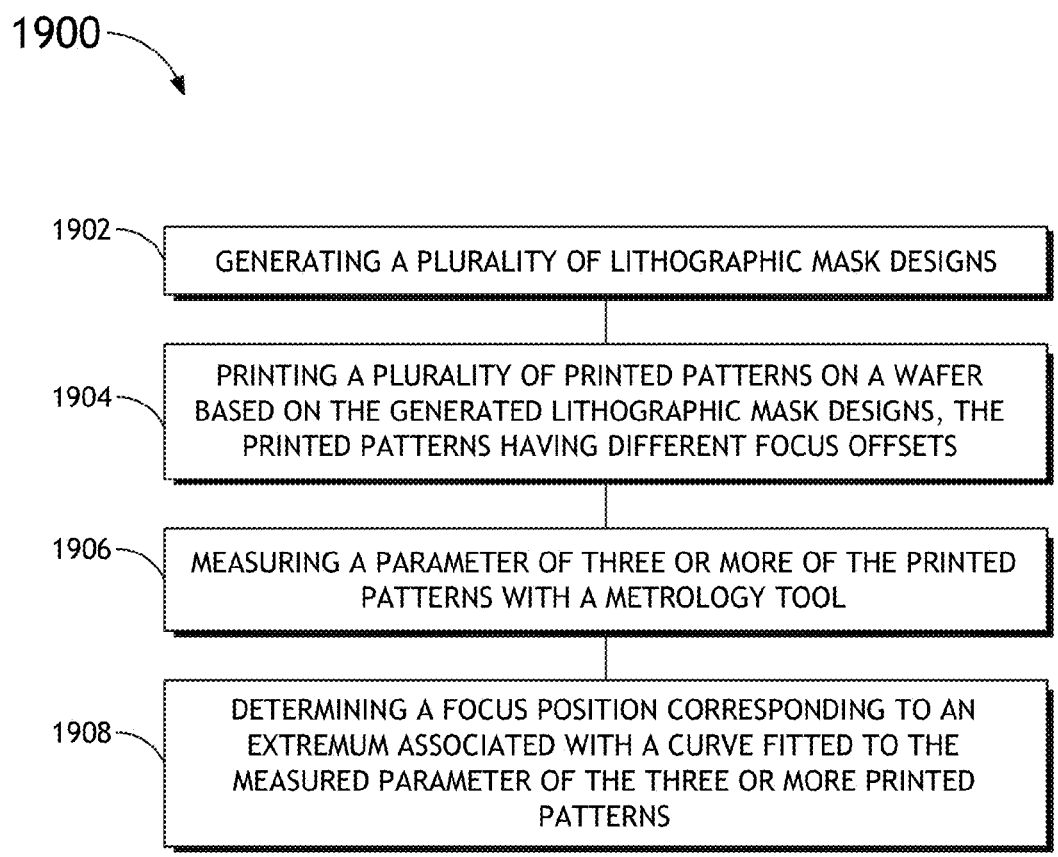
FIG. 19A is process flow diagram illustrating steps performed in a method for determining one or more mask designs suitable for creating printed patterns sensitive to focus, in accordance with an embodiment of the present invention.
Figure 19B:
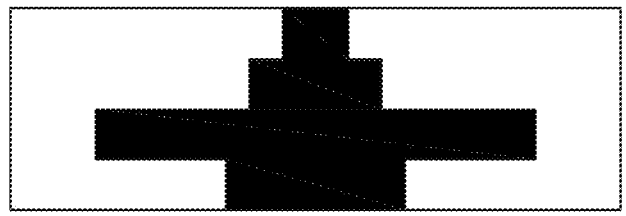
FIGS. 19B-19E illustrate a series of mask designs meeting the requirements of the mask design procedure, in accordance with one embodiment of the present invention.
Figure 19C:
Figure 19D:
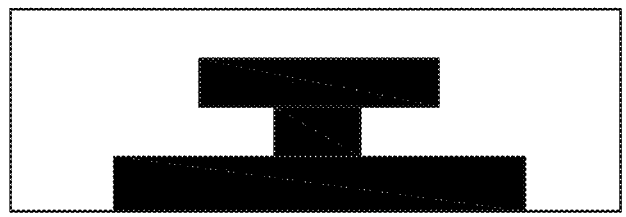
Figure 19E:

FIG. 19A is process flow diagram illustrating steps performed in a method 1900 for determining one or more mask designs suitable for creating printed patterns sensitive to focus, in accordance with an embodiment of the present invention. It is noted herein that the steps of method 1900 may be carried by any combination of lithography systems, metrology systems and/or computation systems known in the art. For example, the method 1900 may be carried out by an integrated lithography patterning device/metrology/computational tool. For instance, the integrated lithography patterning device/metrology/computational tool may include the lithography pattern device 100 of FIG. 1A and the metrology tool 120 of FIG. 1B.

In step 1902, a plurality of lithographic mask designs is generated. In one embodiment, the method 1900 includes generating a plurality of different mask designs suitable for providing printed patterns, with the only difference between the printed patterns being their focus offsets.

Figure 19F:
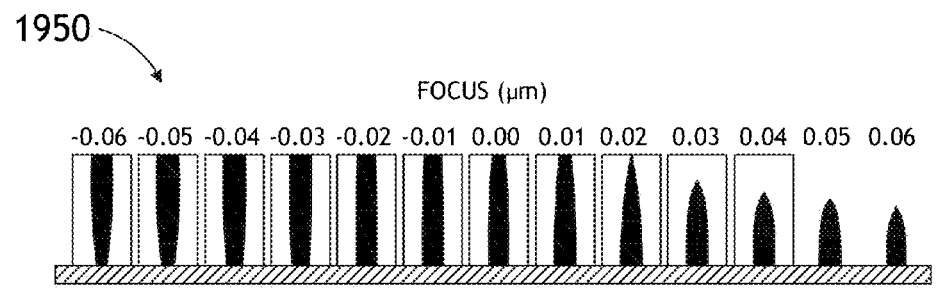
FIGS. 19F-19I illustrate a series of printed pattern profiles produced by the mask designs meeting the mask design procedure, in accordance with one embodiment of the present invention.
Figure 19G:
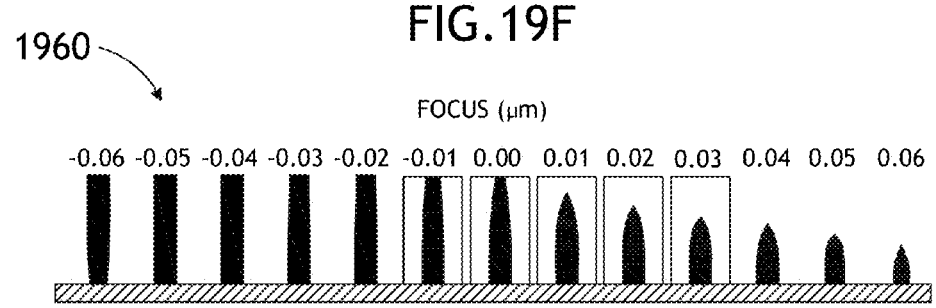
Figure 19H:
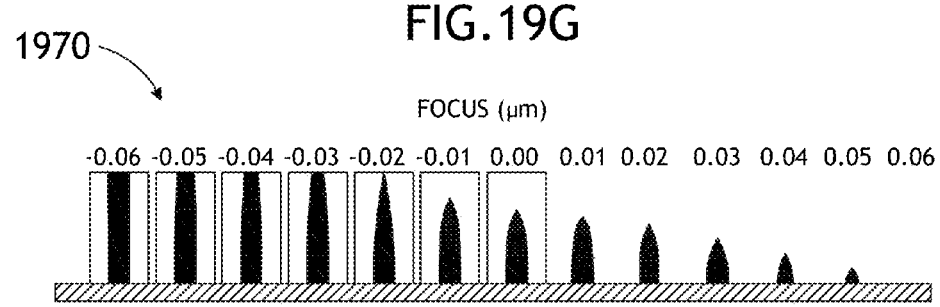
Figure 19I:
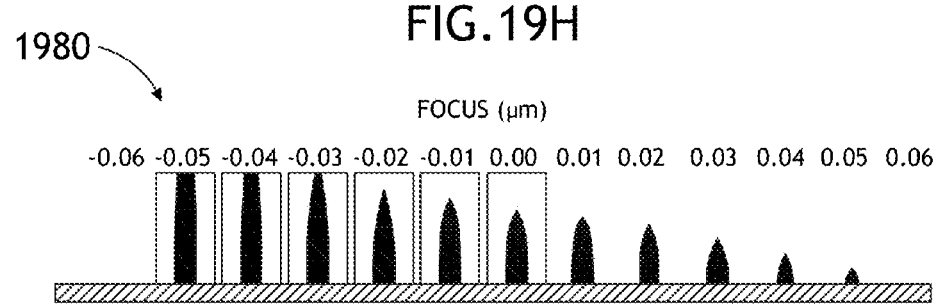

In step 1904, a plurality of printed patterns is printed on a wafer based on the generated lithographic mask designs. In one embodiment, using a pitch in the range between the minimal design rule (DR) and two times the minimal DR in a two beam illumination scheme for which the aerial image is described by zero and first harmonics may be created. In this regard, the intensity associated with the aerial image is provided by:

$$I = A + B \cdot \cos[\phi_0 + \gamma \cdot \Delta F] \cdot \cos\left[\frac{2\pi}{P}x\right] \quad \text{Eq. 5}$$

Where $\phi_0$ depends on the mask design and mask topography and $\gamma \cdot \Delta F$ represents the defocus term. It is noted herein that the use of different mask designs providing the same, or nearly the same, A and B values, but different $\phi_0$ may result in a number of printed patterns having different focus offsets $\phi_0$. FIGS. 19B-19E illustrate a series of mask designs 1910-1940 meeting the requirement of step 1904. FIGS. 19F-19G illustrate the printed pattern profiles corresponding with the designs 1910-1940 respectively, with each set of patterns having a different focus offset.

In step 1906, one or more parameters of at least three of the printed patterns are measured with a metrology tool. In one embodiment, the intensity of one or more signals from each printed pattern is measured using one or more metrology tools. For example, the metrology tool 120 of FIG. 1B may measure the signal intensity of light from the printed patterns 114. In one embodiment, the metrology tool 122 may include, but is not limited to, an angular resolved scatterometry tool. In another embodiment, the metrology tool 12 may include, but is not limited to, a spectroscopic scatterometry tool.

Figure 19K:
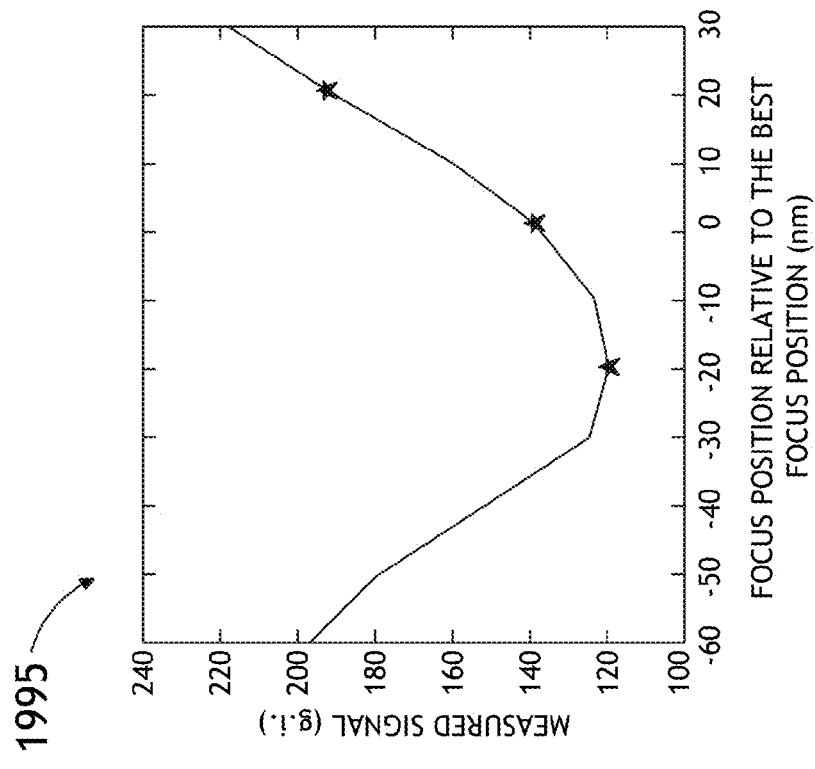
FIGS. 19J-19K illustrate the parabolic behavior of a measured signal as a function of focus position relative to the best focus position, in accordance with one embodiment of the present invention.
Figure 19J:
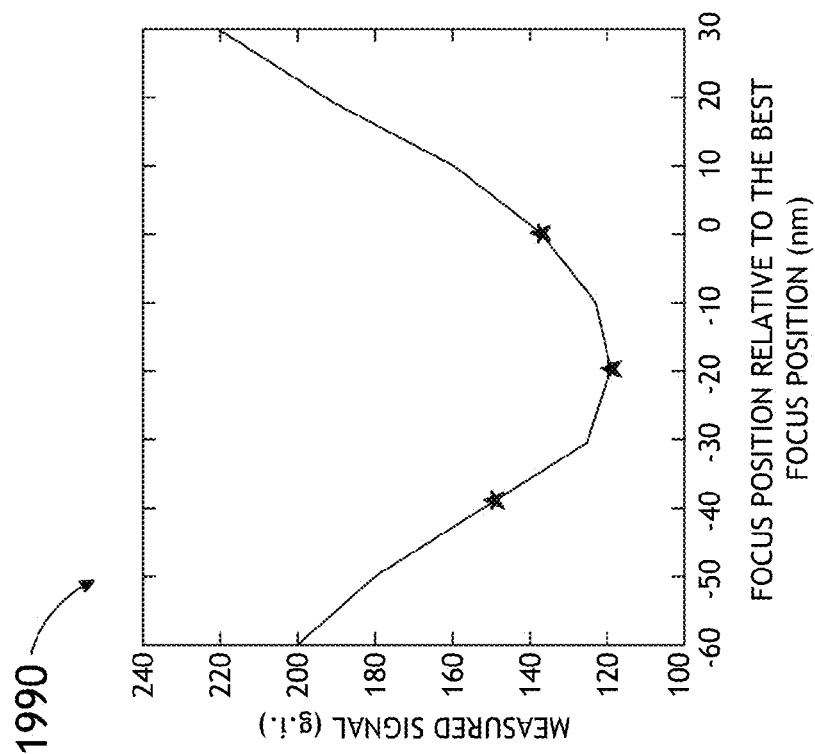

In one embodiment, the dependence of the measured signal on focus position may display parabolic behavior at each pixel, corresponding to a specific wavelength (in the case of spectroscopic scatterometry) or pupil point (in the case of angular resolved scatterometry). In this regard, the signal measured at each pixel may be described by:

$$I = \alpha \cdot (F + \tilde{F})^2 + I_0 \quad \text{Eq. 6}$$

where $\alpha$ and $I_0$ are the same for all three printed cells and the only difference is manifest in the focus offset value $\tilde{F}$. The parabolic behavior described above is evident in FIGS. 19J and 19K. FIG. 19J illustrates measured signal as a function of focus position relative to the best focus position for 3 printed patterns, depicted with stars. The solid curve represents a fitted curve to the measured signal data points, clearly highly parabolic behavior. Similarly, FIG. 19K depicts a parabolic curve fitted to a different group of printed patterns.

In step 1908, a focus position corresponding to an extremum associated with a curve fitted to the measured parameter of the three or more of the printed patterns may be determined. In this regard, the focus position corresponding to the minimum intensity level, in the case of the examples in FIG. 19J-19K, may be determined.

In another embodiment, the determined focus position may be calibrated with a focus-exposure matrix wafer. For example, the focus position may be for each mask design and/or cell separately, such that the shift of position of the parabola center from the position corresponding to the nominal focus position is a lithography printing tool focus position error. It is noted herein that the advantage of such an approach is that the result of measurement does not depend on tool imperfection since the focus shift can be calculated as:

$$\left.\begin{array}{l} I_1 = \alpha \cdot (F + F_1)^2 + I_0 \\ I_2 = \alpha \cdot (F + F_2)^2 + I_0 \\ I_3 = \alpha \cdot (F + F_3)^2 + I_0 \end{array}\right\} \Rightarrow \frac{I_2 - I_1}{I_3 - I_2} = \frac{2F \cdot (F_2 - F_1) + F_2^2 - F_1^2}{2F \cdot (F_3 - F_2) + F_3^2 - F_2^2} \quad \text{Eq. 7}$$

Where the focus shift F does not depend on any multiplicative or additive factor to measured signals 11, 12 and 13. The focus offsets F1, F2 and F3 are defined relative to the position of the parabola center. In another embodiment, in order to include the dose measurement into this scheme an additional cell may be added corresponding to the aerial image with A→A*(1+∈) and B→B*(1+∈) which will provide a printed pattern corresponding to different exposure value. In another embodiment, dose measurement may include usage of a specialized dose target. For example, a dose target may include, but is not limited to, a design rule target, which is only weakly dependent on focus. It is noted herein that both embodiments described above may provide for the decorrelation of focus and dose measurements.

It is further noted that the focus error value may be calculated per pixel (or wavelength in the case of spectroscopic scatterometry tool or pupil point in the case of angular resolved scatterometry tool). As such, the resulting value of the focus error is reported as a weighted average, where the weight may be tailored to provide for best robustness, accuracy, precision, tool-to-tool matching and the like.

Figure 20:
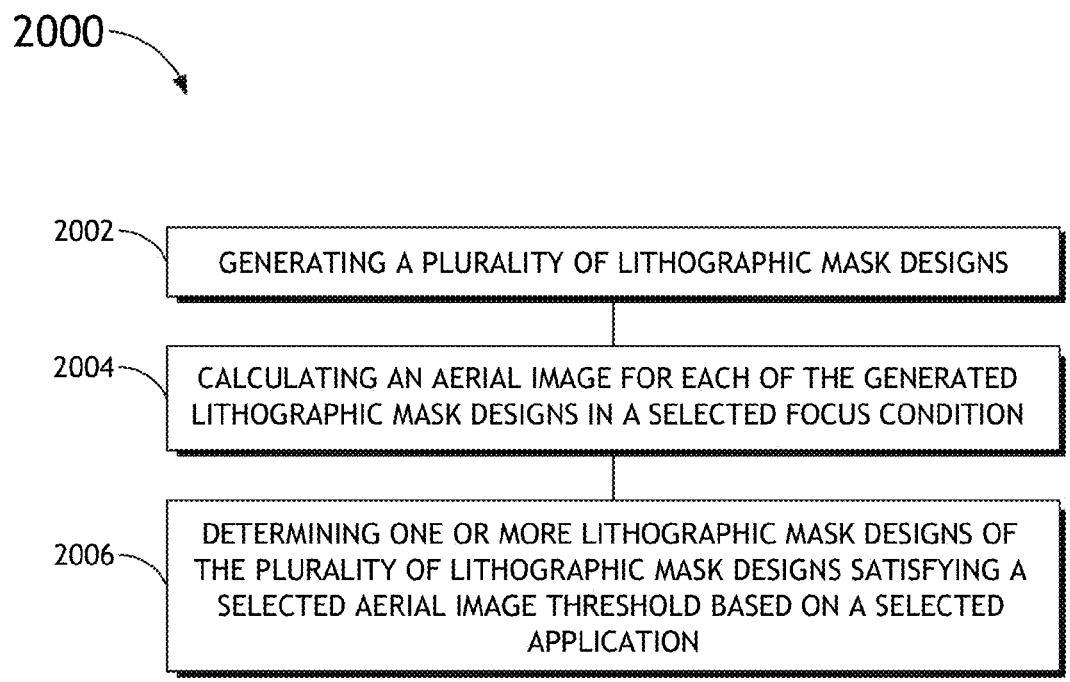
FIG. 20 is process flow diagram illustrating steps performed in a method for determining one or more mask designs having a selected set of properties, in accordance with an embodiment of the present invention.

FIG. 20 is process flow diagram illustrating steps performed in a method 2000 for determining one or more mask designs having a selected set of properties, in accordance with an embodiment of the present invention. It is noted herein that the steps of method 2000 may be carried by any combination of lithography systems, metrology systems and/or computation systems known in the art. For example, the method 2000 may be carried out by the computational system 160 of the lithography tool 100. It is further noted that the method of 2000 may be carried out with an off-line computational system 160 (i.e., computational system not coupled to an operating lithography or metrology tool).

In step 2002, a plurality of lithographic mask designs suitable for a selected application are generated. In one embodiment, a computational system 160 (e.g., one or more processors executing program instructions stored in a non-transitory memory medium) may initiate method 2000 by storing a set of possible mask designs corresponding to a selected application. In this regard, the computational system may provide a set of mask designs with a given x-direction pitch and a y-direction pitch. In one embodiment, the computational system may divide the area corresponding to one pitch in the x-direction and one pitch in the y-direction into a number of pixels. The size of the pixels may correspond to the resolution limit of the implemented mask writing technology. In another embodiment, the computational system may define a pixel as 'on' if it is filled by the mask material. In another embodiment, the computational system may define a pixel as 'off' if it is not filled by mask material. In another embodiment, the computational system may further provide all possible combinations of 'on'-'off' pixel states that will define a list of mask designs. An example of such a mask design is provided in FIG. 17A, described previously herein.

In step 2004, an aerial image for each of the generated lithographic mask designs is calculated for a selected focus condition. In one embodiment, the computational system 160 calculates an aerial image for each mask design in a selected focus position. In one embodiment, the computational system 160 calculates an aerial image for each mask design in a select range of focus values. In another embodiment, the computational system 160 calculates an aerial image for each mask design utilizing one or more Maxwell equations solvers (e.g., RCWA) and the predefined lithography printing device (e.g., scanner) illumination conditions (e.g., type of illumination, polarization condition and the like).

In step 2006, one or more lithographic mask designs of the plurality of lithographic mask satisfying a selected aerial image threshold based on a selection application is determined. In this regard, based on the aerial images calculated in Step 2004, and a given aerial image threshold, all mask designs that do not provide a well printed pattern may be eliminated. As such, mask designs that satisfy the required constraints corresponding with a selected application remain. For example, in the case where the selected application includes phase apodization with a selected amplitude and phase, only mask designs suitable for providing the required amplitude and phase of the zero diffraction order remain. By way of another example, in the case where the selected application includes measurement of scanner aberrations, only mask designs with non-zero amplitudes (e.g., usable to measure printed pattern placement error) of a selected diffraction orders remain. By way of another example, in the case where the selected application includes creation of asymmetric illumination (e.g., in order to transfer focus error into pattern placement error), only asymmetric mask designs with non-zero amplitudes of positive or negative diffraction orders remain.

It is further recognized that a given approach can be used with a different number of targets corresponding to different focus offsets and the corresponding model. For example, for an n-cell target, a polynomial model may be used, which is of degree n−1. It is noted herein that the model is not limited to a polynomial based model and may include any parametric function known in the art. It is recognized, however, that when calibrating properties used for a given measurement it is advantageous that they depend on a differential signal (to eliminate additive error) or a ratio of differential signals (to eliminate both additive and multiplicative errors).

Figure 21A:
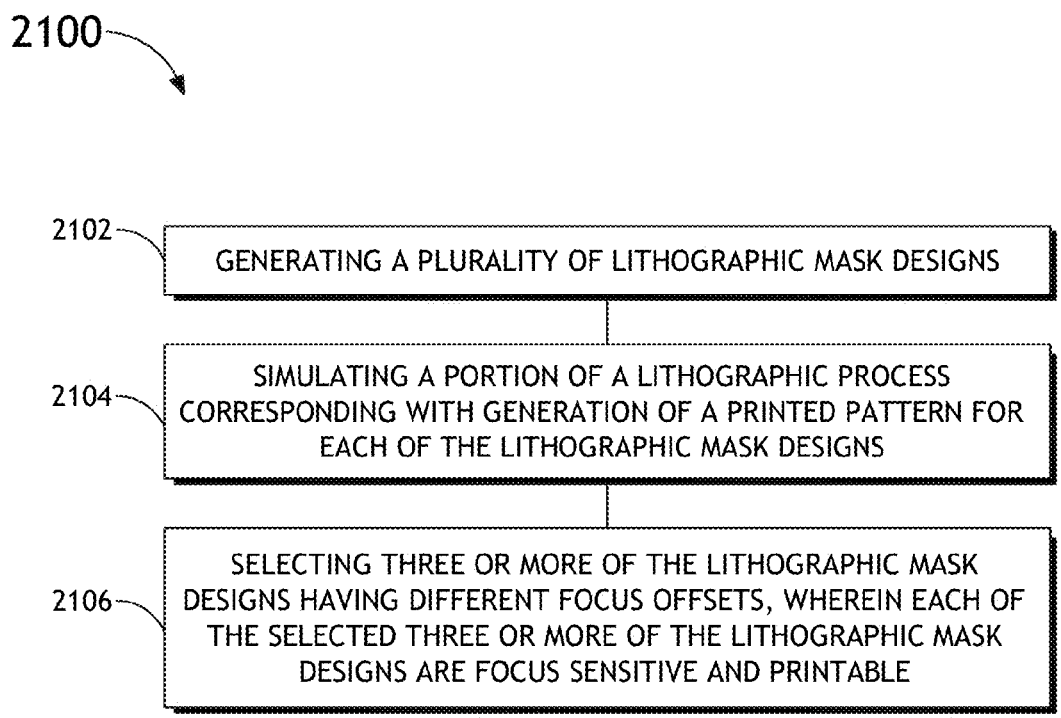
FIG. 21A is process flow diagram illustrating steps performed in a method for determining a target design sensitive to focus, in accordance with an embodiment of the present invention.

FIG. 21A is process flow diagram illustrating steps performed in a method 2100 for determining a target design sensitive to focus, in accordance with an embodiment of the present invention. It is noted herein that method 2100 may be carried out using any lithography, metrology and/or computational architecture known in the art. For example, one or more steps of method 2100 may be carried out utilizing one or more systems 100, 120, 140 or 160 described previously herein. In step 2102, a plurality of lithographic mask designs is provided. For example, a list of mask designs is generated. In step 2104, a portion of a lithographic process corresponding with generation of a printed pattern for each of the lithographic mask designs is simulated. In step 2106, three or more of the lithographic mask designs having different focus offsets are selected, wherein each of the selected three or more of the lithographic mask designs are focus sensitive and printable.

Figure 21B:
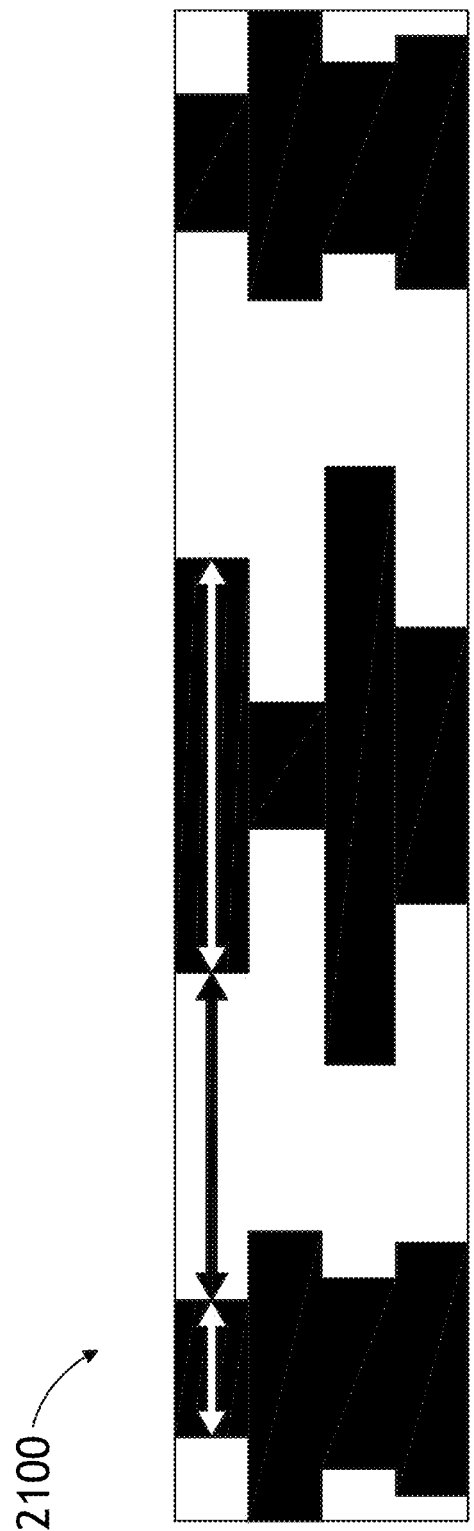
FIG. 21B illustrates a designed target with multiple cells with different offset focus, in accordance with one embodiment of the present invention.

As shown in FIG. 21B, the number of pixels and their 'states' are stable but their sizes are varied. In the example of FIG. 21B, there are 24 pixels, with 12 'on' and 12 'off'.

It is noted that any other method to form the list of mask designs may be sufficient as well. For example, instead of an exhaustive search a starting point may include a starting mask design, which is then changed iteratively utilizing a Newton-type method to obtain the desired A and B (described above).

For each mask design from the list some portion of the lithographic process may be simulated. For example, an illumination portion of the lithographic process (e.g., aerial image, image in resist and the like) may be simulated. Then, the list of mask designs may be divided into groups corresponding to the same A and B values with a predefined threshold. Finally, a group consisting of at least 3 (for parabolic case) mask designs with different focus offsets and good sensitivity and printability may be chosen. For example, as shown in FIG. 21B, the target 2110 may include three cells, each with a different offset focus. The sensitivity and printability testing can be carried out using a full lithographic simulation (e.g., PROLITH).

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims.

What is claimed:

1. A lithography mask for producing printed patterns for causing a shift in best focus position of a lithography printing tool comprising:

a plurality of cell structures formed from a substantially opaque material, wherein each cell structure includes a set of features having an unresolvable segmentation pitch along a first direction, wherein the unresolvable segmentation pitch along the first direction is smaller than a minimal design rule pitch, wherein the plurality of cell structures have a pitch along a second direction perpendicular to the first direction, wherein the unresolvable segmentation pitch is suitable for generating a printed pattern for shifting the best focus position of the lithography tool by a selected amount to achieve a selected level of focus sensitivity.

2. The lithography mask of claim 1, wherein the substantially opaque material includes chrome.

3. The lithography mask of claim 1, wherein the plurality of cell structures includes a first cell structure and at least a second cell structure, wherein the first cell structure includes a set of features having a first segmentation pitch, wherein the second cell structure includes a set of features having a second segmentation pitch different than the first segmentation pitch.

4. The lithography mask of claim 1, wherein the plurality of cell structures is configured to form a local focus-exposure matrix on a production wafer.

5. The lithography mask of claim 1, wherein at least some of the plurality of cell structures include a symmetric assist feature.

6. The lithography mask of claim 1, wherein at least some of the plurality of cell structures include an asymmetric assist feature.

7. A lithography mask for producing printed patterns for causing a shift in best focus position of a lithography printing tool comprising:
 a first one-dimensional structure formed from a first set of sub-structures having a first pitch along a first direction; and
 at least one additional one-dimensional structure formed from an additional set of sub-structures having a second pitch along the first direction, wherein the first one-dimensional structure is periodic along a second direction perpendicular to the first direction with a third pitch, wherein the at least one additional one-dimensional structure is periodic along the second direction perpendicular to the first direction with a fourth pitch, wherein at least one of the first pitch, the second pitch, the third pitch and the fourth pitch is unresolvable by illumination of the lithography printing tool.

8. The lithography mask of claim 7, wherein the first one-dimensional structure and the at least one additional one-dimensional structure for a symmetric structure.

9. The lithography mask of claim 7, wherein the first one-dimensional structure and the at least one additional one-dimensional structure for an asymmetric structure.

10. A lithography printing tool for printing patterns comprising:
 a radiation source;
 a mask support device configured to secure a segmented mask, wherein the segmented mask includes a plurality of cell structures formed from a substantially opaque material, wherein each cell structure includes a set of features having an unresolvable segmentation pitch, wherein the unresolvable segmentation pitch along a first direction is smaller than the wavelength of illumination of the lithography printing tool, wherein the plurality of cell structures have a pitch along a second direction perpendicular to the first direction, wherein the unresolvable segmentation pitch is suitable for generating a printed pattern for shifting the best focus position of the lithography tool by a selected amount to achieve a selected level of focus sensitivity; and
 a set of projection optics configured to direct illumination transmitted by the mask onto a wafer.

11. The lithography printing tool of claim 10, wherein the unresolvable segmentation pitch along the first direction is smaller than a minimal design rule pitch.

12. The lithography printing tool of claim 10, wherein the substantially opaque material includes chrome.

13. The lithography tool of claim 10, wherein the plurality of cell structures includes a first cell structure and at least a second cell structure, wherein the first cell structure includes a set of features having a first segmentation pitch, wherein the second cell structure includes a set of features having a second segmentation pitch different than the first segmentation pitch.

14. The lithography printing tool of claim 10, wherein the plurality of cell structures is configured to form a local focus-exposure matrix on a production wafer.

15. The lithography printing tool of claim 10, wherein at least some of the plurality of cell structures include a symmetric assist feature.

16. The lithography printing tool of claim 10, wherein at least some of the plurality of cell structures include an asymmetric assist feature.

17. The lithography printing tool of claim 10, wherein the radiation source comprises:
 a light source configured to emit at least one of ultraviolet light, extreme ultraviolet light or deep ultraviolet light.

18. A lithography printing tool for printing patterns comprising:
 a radiation source;
 a mask support device configured to secure a segmented mask, wherein the segmented mask includes a first one-dimensional structure formed from a first set of sub-structures having a first pitch along a first direction; and at least one additional one-dimensional structure formed from an additional set of sub-structures having a second pitch along the first direction, wherein the first one-dimensional structure is periodic along a second direction perpendicular to the first direction with a third pitch, wherein the at least one additional one-dimensional structure is periodic along the second direction perpendicular to the first direction with a fourth pitch, wherein at least one of the first pitch, the second pitch, the third pitch and the fourth pitch is unresolvable by illumination of the lithography printing tool; and
 a set of projection optics configured to direct illumination transmitted by the mask onto a wafer.

19. The lithography printing tool of claim 18, wherein the first one-dimensional structure and the at least one additional one-dimensional structure form a symmetric structure.

20. The lithography printing tool of claim 18, wherein the first one-dimensional structure and the at least one additional one-dimensional structure form an asymmetric structure.

21. The lithography printing tool of claim 18, wherein the radiation source comprises:
 a light source configured to emit at least one of ultraviolet light, extreme ultraviolet light or deep ultraviolet light.

* * * * *